United States Patent
Kim

(10) Patent No.: US 7,804,718 B2
(45) Date of Patent: Sep. 28, 2010

(54) PARTIAL BLOCK ERASE ARCHITECTURE FOR FLASH MEMORY

(75) Inventor: Jin-Ki Kim, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 340 days.

(21) Appl. No.: 11/779,685

(22) Filed: Jul. 18, 2007

(65) Prior Publication Data

US 2008/0219053 A1 Sep. 11, 2008

Related U.S. Application Data

(60) Provisional application No. 60/893,432, filed on Mar. 7, 2007, provisional application No. 60/914,849, filed on Apr. 30, 2007.

(51) Int. Cl.
G11C 16/04 (2006.01)

(52) U.S. Cl. ............................ 365/185.29; 365/185.11; 365/185.33

(58) Field of Classification Search ............ 365/185.02, 365/185.03, 185.11 X, 185.17, 185.27, 185.29 O, 365/185.33 X, 185.11, 185.29, 185.33
See application file for complete search history.

(56) References Cited

U.S. PATENT DOCUMENTS

| | | | |
|---|---|---|---|
| 5,109,361 A | 4/1992 | Yim et al. | |
| 5,270,980 A * | 12/1993 | Pathak et al. ............ | 365/185.12 |
| 5,278,785 A | 1/1994 | Hanzani | |
| 5,299,162 A | 3/1994 | Kim et al. | |
| 5,365,484 A | 11/1994 | Cleveland et al. | |
| 5,448,529 A | 9/1995 | Reddy et al. | |
| 5,473,563 A | 12/1995 | Suh et al. | |
| 5,541,879 A | 7/1996 | Suh et al. | |
| 5,546,341 A | 8/1996 | Suh et al. | |
| 5,671,178 A | 9/1997 | Park et al. | |
| 5,796,657 A | 8/1998 | Lee et al. | |
| 5,805,510 A | 9/1998 | Miyakawa et al. | |
| 5,835,935 A | 11/1998 | Estakhri et al. | |
| 5,847,994 A | 12/1998 | Motoshima et al. | |
| 5,886,923 A | 3/1999 | Hung | |

(Continued)

FOREIGN PATENT DOCUMENTS

EP 0777235 A2 6/1997

OTHER PUBLICATIONS

Kirisawa et al., "A NAND Structured Cell with a New Programming Technology", IEEE, 1990, pp. 129-130.

(Continued)

*Primary Examiner*—VanThu Nguyen
(74) *Attorney, Agent, or Firm*—Shin Hung; Borden Ladner Gervais LLP

(57) ABSTRACT

A method and system for increasing the lifespan of a flash memory device by selectively erasing sub-blocks of a memory block. Each physical memory block of the flash memory device is dividable into at least two logical sub-blocks, where each of the at least two logical sub-blocks is erasable. Therefore, only the data of the logical sub-block is erased and reprogrammed while unmodified data in the other logical sub-block avoids unnecessary program/erase cycles. The logical sub-blocks to be erased are dynamically configurable in size and location within the block. A wear leveling algorithm is used for distributing data throughout the physical and logical sub-blocks of the memory array to maximize the lifespan of the physical blocks during programming and data modification operations.

24 Claims, 20 Drawing Sheets

U.S. PATENT DOCUMENTS

| | | | |
|---|---|---|---|
| 5,937,425 | A | 8/1999 | Ban |
| 5,995,417 | A | 11/1999 | Chen et al. |
| 6,026,021 | A | 2/2000 | Hoang |
| 6,107,658 | A | 8/2000 | Itoh et al. |
| 6,118,705 | A | 9/2000 | Gupta et al. |
| 6,172,911 | B1 | 1/2001 | Tanaka et al. |
| 6,230,233 | B1 | 5/2001 | Lofgren et al. |
| 6,339,560 | B1 | 1/2002 | Naritake |
| 6,359,810 | B1 | 3/2002 | Gupta et al. |
| 6,556,504 | B2 | 4/2003 | Kwon et al. |
| 6,594,183 | B1 | 7/2003 | Lofgren et al. |
| 6,732,116 | B2 | 5/2004 | Banerjee et al. |
| 6,732,221 | B2 | 5/2004 | Ban |
| 6,763,424 | B2 | 7/2004 | Conley |
| 6,850,443 | B2 | 2/2005 | Lofgren et al. |
| 6,862,222 | B2 | 3/2005 | Roohparvar |
| 6,885,583 | B2 | 4/2005 | Tanaka |
| 6,914,846 | B2 * | 7/2005 | Harari et al. ........... 365/230.03 |
| 6,940,759 | B2 | 9/2005 | Tsang et al. |
| 6,958,940 | B2 | 10/2005 | Takase et al. |
| 7,006,383 | B2 * | 2/2006 | Tanaka ................. 365/185.29 |
| 7,161,842 | B2 | 1/2007 | Park |
| 7,170,795 | B2 | 1/2007 | Lee |
| 7,259,992 | B2 * | 8/2007 | Shirota ................. 365/185.21 |
| 2004/0015663 | A1 | 1/2004 | Choi |
| 2005/0095769 | A1 | 5/2005 | Takase et al. |
| 2005/0141284 | A1 | 6/2005 | Futatsuyama |
| 2006/0050594 | A1 | 3/2006 | Park |
| 2006/0133155 | A1 | 6/2006 | Fujita et al. |
| 2006/0256623 | A1 | 11/2006 | Roohparvar |
| 2006/0291289 | A1 | 12/2006 | Lee |

OTHER PUBLICATIONS

Aritome et al., "A Reliable Bi-Polarity Write/Erase Technology in Flash EEProms", IEEE, 1990, pp. 5.6.1-5.6.4.

Shirota et al., "A 2.3um2 Memory Cell Structure for 16Mb NAND EEProms", IEEE, 1990, pp. 5.4.1-5.4.4.

Momodomi et al., "A 4-Mb NAND EEProm with Tight Programmed VT Distribution", IEEE, 1991, pp. 492-496.

Kim et al., "A 120-mm2 64-Mb NAND Flash Memory Achieving 180 ns/Byte Effective Program Speed", IEEE, 1997, pp. 670-680.

Suh et al., "A 3.3 32 Mb NAND Flash Memory with Incremental Step Pulse Programming Scheme", IEEE, 1995, pp. 1149-1156.

Imamiya et al., "A 125-mm2 1-Gb NAND Flash Memory with 10-Mbyte/s Program Speed", IEEE Journal of Solid-State Circuits, vol. 37, No. 11, Nov. 2002, pp. 1493-1501.

Takeuchi et al., "A 56nm CMOS 99 mm2 8 Gb Multi-level NAND Flash Memory with 10MB/s Program Throughput", IEEE International Solid-State Circuits Conferrence, 2006, pp. 144-146.

Samsung Electronics Product Information 256M×8 Bit / 128M×16 Bit / 512M×8 Bit NAND Flash Memory, pp. 1-41.

Gal et al., "Algorithms and Data Structures for Flash Memories", ACM Computing Surveys, vol. 37, No. 2, Jun. 2005, pp. 138-163.

Lee et al., "A 90-nm CMOS 1.8-V 2-Gb NAND Flash Memory for Mass Storage Applications", IEEE Journal of Solid-State Circuits, vol. 38, No. 11, Nov. 2003, pp. 1934-1942.

Toshiba Product Information "Toshiba MOS Digital Integrated Circuit Silicon Gate CMSOS", May 19, 2003, pp. 1-32.

Written Opinion and International Search Report for PCT Patent Application No. PCT/CA2008/000411, dated Jul. 25, 2008.

Hara, T. et al., "A 146mm2 8Gb NAND Flash Memory with 70nm CMOS Technology", ISSCC Session 2 Non-Volatile Memory 2.1, IEEE International Solid-State Circuits Conference, Feb. 2005, pp. 44, 45 and 584.

Tanzawa, T. et al., "Circuit Techniques for a 1.8-V-Only NAND Flash Memory", IEEE Journal of Solid-State Circuits, vol. 37, No. 1, Jan. 2002, pp. 84-89.

Tanaka, T. et al., "A quick Intelligent Page-Programming Architecture and a Shieldedbitline sensing method for 3 V Only NAND Flash Memory", IEEE Journal of Solid-State Circuits, vol. 29, Issue 11, Nov. 1994, pp. 1366-1373.

Lee, J. et al., "High Performance 1-Gb NAND Flash Memory with 0.12-m Technology", IEEE Journal of Solid State Circuits, vol. 37, No. 11, Nov. 2002, pp. 1502-1509.

Jung, T. et al., "A 117-mm2 3.3-V Only 128-Mb Multilevel NAND Flash Memory for Mass Storage Applications", IEEE Journal of Solid-State Circuits, vol. 31, No. 11, Nov. 1996, pp. 1575-1583.

Tomita, N. et al., "A 62-ns 16Mb CMOS EPROMm with Voltage Stress Relaxation Technique" IEEE Journal of Solid-State Circuits vol. 26, No. 11, Nov. 1991, pp. 1593-1599.

Samsung Electronics Co. Ltd, "1G×8 Bit / 2G×8 Bit / 4G×8 Bit NAND Flash Memory", K9XXG08UXA, Jul. 18, 2006, pp. 1-50.

Samsung Electronics Co. Ltd, "2G×8 Bit NAND Flash Memory", K9GAG08U0M, Apr. 12, 2006, pp. 1-48.

Toshiba, "16 GBIT (2G×8 Bit) CMOS NAND E2PROM (Multi-Level-Cell)", TC58NVG4D1DTG00, Nov. 9, 2006.

Intel Corporation, "Intel® Advanced+ Boot Block Flash Memory (C3)", May 2005, pp. 1-72.

M-Systems Flash Disk Pioneers Ltd., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.

Samsung Electronics Co. Ltd, OneNAND4G (KFW4G16Q2M-DEB6), OneNAND2G (KFH2G16Q2M-DEB6), OneNAND1G (KFW1G16Q2M-DEB6) Flash Memory, One NAND™ Specification Ver. 1.2, pp. 1-125, Dec. 23, 2005.

Intel Corporation, "Intel Strataflash Wireless Memory (L18)", Order No. 251902, Revision 010, Aug. 2005.

Spansion Data Sheet, S70GL01GN00 MirrorBit Flash 1024 Megabit, 3.0 Volt-only Page Mode Flash Memory Featuring 110 mm MirrorBit Process Technology, Jun. 1, 1995.

U.S. Appl. No. 11/715,838, Notice of Allowance dated Feb. 9, 2009.

U.S. Appl. No. 11/711,043, Notice of Allowance dated Feb. 23, 2009.

U.S. Appl. No. 12/416,512, Office Action dated Sep. 9, 2009.

* cited by examiner

PARTIAL BLOCK ERASE ARCHITECTURE FOR FLASH MEMORY

CROSS REFERENCE TO RELATED APPLICATIONS

This application claims the benefit of priority of U.S. Provisional Patent Application No. 60/893,432 filed Mar. 7, 2007, and U.S. Provisional Patent Application No. 60/914,849 filed Apr. 30, 2007, both of which are incorporated herein by reference in their entirety.

BACKGROUND

Flash memory is a commonly used type of non-volatile memory in widespread use as mass storage for consumer electronics, such as digital cameras and portable digital music players for example. The density of a presently available flash memory chip can be up to 32 Gbits (4 GB), which is suitable for use in popular USB flash drives since the size of one flash chip is small.

FIG. 1 is a general block diagram of typical flash memory of the prior art. flash memory 10 includes logic circuitry such as control circuit 12, for controlling various functions of the flash circuits, registers for storing address information, data information and command data information, high voltage circuits for generating the required program and erase voltages, and core memory circuits such as row address decoder 14 and row address decoder buffer 16 for accessing the memory array 18. The control circuit 12 includes a command decoder and logic for executing the internal flash operations, such as read, program and erase functions. The functions of the shown circuit blocks of flash memory 10 are well known in the art. Persons skilled in the art will understand that flash memory 10 shown in FIG. 1 represents one possible flash memory configuration amongst many possible configurations.

The memory cell array 18 of the flash memory 10 of FIG. 1 consists of any number of banks, which is a selected design parameter for a particular flash device. FIG. 2 is a schematic illustration showing the organization of one bank 20 of the memory cell array 18 of FIG. 1. Bank 20 is organized as blocks (Block[0] to Block[k]), and each block consists of pages ($WL_0$ to $WL_i$). Both k and i are non-zero integer values. Each page corresponds to a row of memory cells coupled to a common wordline. A detailed description of the memory cells of the block follows.

Each block consists of NAND memory cell strings, having flash memory cells 22 serially coupled arranged and electrically coupled to each other. Accordingly, wordlines $WL_0$ to $WL_i$ are coupled to the gates of each flash memory cell in the memory cell string. A string select device 24 coupled to signal SSL (string select line) selectively connects the memory cell string to a bitline 26, while a ground select device 28 coupled to signal GSL (ground select line) selectively connects the memory cell string to a source line, such as VSS. The string select device 24 and the ground select device 28 are n-channel transistors.

Bitlines 26 ($BL_0$ to $BL_j$, where j is a non-zero integer value) are common to all blocks of bank 20, and each bitline 26 is coupled to one NAND memory cell string in each of blocks [0] to [k]. Each wordline ($WL_0$ to $WL_i$), SSL and GSL signal is coupled to the same corresponding transistor device in each NAND memory cell string in the block. As those skilled in the art should be aware, data stored in the flash memory cells along one wordline is referred to as a page of data.

Coupled to each bitline outside of the bank 20 is a data register 30 for storing one page of write data to be programmed into one page of flash memory cells. Data register 30 also includes sense circuits for sensing data read from one page of flash memory cells. During programming operations, the data registers perform program verify operations to ensure that the data has been properly programmed into the flash memory cells coupled to the selected wordline. To achieve high density, each flash memory cell will store at least two bits of data, and is generally referred to as a multi-bit-cell (MBC).

Those skilled in the art will understand that an issue with MBC flash memory is the sensitivity of its memory cells to program disturb. Program disturb results from the capacitive coupling between adjacent wordlines and floating gates, which are formed closer to each other with each fabrication technology generation. Hence, high voltages applied to one cell during programming can shift a programmed threshold voltage of an adjacent cell to one representing a different logic state, while the programmed state of one cell can affect the threshold voltage of an adjacent cell currently being programmed. To minimize program disturb in MBC flash memory, programming within a block will start at the page corresponding to $WL_0$, and proceed sequentially up to $WL_i$. Alternately, programming can start at $WL_i$ and proceed sequentially down to $WL_0$. These schemes for programming NAND MBC flash memory cells are well known in the industry. Once the block has been fully programmed with data, programming of the next file or set of data begins at $WL_0$ of the next block. Within a device, blocks are typically programmed in sequence.

It is well known that flash memory devices have a limited number of erase-program cycles before they can no longer be used to store data reliably. More specifically, flash memory cells are subject to program/erase cycle wearing, which is a progressive degradation of a flash memory cell due to cumulative program and erase operations. Those skilled in the art will understand that a memory block is always erased first prior to being programmed with data, hence the cycles can be referred to as both program and erase cycles. All currently known flash memory is configured for block erase, meaning that if just one page of data in a block is to be modified/updated, the entire block containing that page is erased and re-programmed with the modified page and the unmodified pages. The effect of such cumulative program and erase operations is the alteration of the program and erase characteristics of the memory cell beyond optimal parameters. When memory cells are degraded, higher program and erase voltages are needed to program or erase the memory cells to the desired threshold voltages. Eventually, the memory cells will fail to retain data properly, which is represented as a programmed threshold voltage. For example, the typical erase-program cycles for an MBC flash memory is about 10,000 cycles.

Currently, most flash memory available is of the MBC type due to the large storage density relative to its chip size. While this is suitable for most consumer applications, the 10,000 cycle program-erase limit may be insufficient for other applications where data programming and erasing is frequent. Therefore, when an MBC flash memory has reached its 10,000 cycle life span, it is no longer usable and must be discarded. This problem is more critical for commercial applications, such as HDD applications, where there are more frequent program-erase cycles. Because HDD applications require higher data integrity than most consumer applications, MBC flash memory is not suited for use due to its relatively short 10,000 cycle life span.

This problem is compounded by the fact that the block size of flash memory devices continues to increase while the data file sizes being stored remain relatively static. For example, block sizes for present day high density flash devices are in the range of 256 KB, but future high density flash devices will have block sizes approaching 512 KB. If the data file stored in the block is small, then more memory cells will be unnecessarily subjected to erase/program cycles relative to a block have the size when the data file is modified.

It is, therefore, desirable to provide a flash memory device operable to have an extended life span.

SUMMARY

It is an aspect of the present embodiments to obviate or mitigate at least one disadvantage of previous flash memory systems.

In a first aspect, there is provided a flash memory device having a memory array and row circuitry. The memory array has at least one block of NAND flash memory cell strings arranged in columns, where the at least one block has a preset number of flash memory cells being selectively erasable. The row circuitry drives first wordlines corresponding to the preset number of flash memory cells to a first voltage when the substrate is biased to an erase voltage for erasing the preset number of flash memory cells. The row decoders drive second wordlines to a second voltage for inhibiting erasure of the flash memory cells coupled to the second wordlines. According to embodiments of the first aspect, the preset number of flash memory cells can be multi-bit-cells (MBC), they can correspond to one sequential set of flash memory cells, or they can correspond to two sequential sets of flash memory cells, where the two sequential sets of flash memory cells are non-adjacent to each other. In another embodiment of the present aspect, the NAND flash memory cell strings of the at least one block are coupled to a common source line, and the flash memory device further includes a source line voltage control circuit for setting a voltage of the common source line between a third voltage and a fourth voltage during an erase verify operation. The fourth voltage is less than the third voltage, and the voltage of the common source line decreases as a number of first wordlines increases.

In a second aspect, there is provided a method for erasing a sub-block of a memory block, where the memory block has a NAND memory cell string coupled to a first wordline, a last wordline, and intermediate wordlines between the first wordline and the last wordline. The method includes issuing a first input address command with a first address; issuing a second input address command with a second address; issuing a partial erase command; and erasing the sub-block having a set of wordlines bound by wordlines corresponding to the first address and the second address.

According to an embodiment of the present aspect, the first address includes a null address and the sub-block includes the set of wordlines bound by one wordline corresponding to the second address and the first wordline. In another embodiment of the present aspect, the second address includes a null address and the sub-block includes the set of wordlines bound by one wordline corresponding to the first address and the last wordline. In yet another embodiment, the method further includes erase verifying the erased sub-block. Erase verifying includes precharging a bitline, biasing the set of wordlines, biasing unselected wordlines, and sensing. The step of precharging includes precharging a bitline coupled to the NAND memory cell string to a precharge voltage level. The set of wordlines are biased to a first voltage for turning on erased memory cells coupled to the set of wordlines. The unselected wordlines are biased to a second voltage for turning on memory cells coupled to the unselected wordlines. Sensing includes sensing a change in the precharge voltage level.

In yet a further embodiment, the first voltage is a negative voltage and the second voltage is a read voltage used during a read operation. Alternately, the first voltage can be 0V while the second voltage is a read voltage used during a read operation. In another embodiment, a common source line coupled to the NAND memory cell string is biased to a variable source bias voltage, which increases from 0V to a maximum voltage as a number of the set of wordlines decreases.

In a third aspect, there is provided a method for wear leveling control when modifying data in a sub-block of a memory block. The method includes programming modified data to an empty sub-block of a new memory block and erasing the sub-block of the memory block. In one embodiment, the method further includes programming new data to a lowest ranking available sub-block, where each memory block includes at least two sub-blocks and the lowest ranking available sub-block includes a set of wordlines most proximate to a first wordline to be programmed in a sequential programming scheme. In another embodiment, the method includes updating an address mapping table to map a logical address of the modified data to a physical address corresponding to the empty sub-block of the new memory block. In yet other embodiments, the empty sub-block is a lowest ranking available sub-block or has a ranking equal to the sub-block. When the ranking of the empty sub-block is equal to the sub-block, the new memory block is empty or includes other data stored in another sub-block having a lower ranking than the empty sub-block. Alternately, the empty sub-block has a ranking higher than the sub-block. In yet a further embodiment, the method includes swapping data in the sub-block with other data in one other sub-block of the memory block when a difference between program/erase cycles of the sub-block and the one other sub-block reaches a predetermined value.

Other aspects and features of the described embodiments will become apparent to those ordinarily skilled in the art upon review of the following description of specific embodiments in conjunction with the accompanying figures.

BRIEF DESCRIPTION OF THE DRAWINGS

The embodiments will now be described, by way of example only, with reference to the attached Figures, wherein.

DETAILED DESCRIPTION

Generally, the embodiments provide a method and system for increasing the lifespan of a flash memory device. Each physical memory block of the flash memory device is dividable into at least two logical sub-blocks, where each of the at least two logical sub-blocks are erasable. Therefore, only the data of the logical block is erased and reprogrammed while unmodified data in the other logical block avoids unnecessary program/erase cycles. The logical sub-blocks to be erased are dynamically configurable in size and location within the block. A wear leveling algorithm is used for distributing data throughout the physical and logical sub-blocks of the memory array to maximize the lifespan of the physical blocks.

Figure 2:
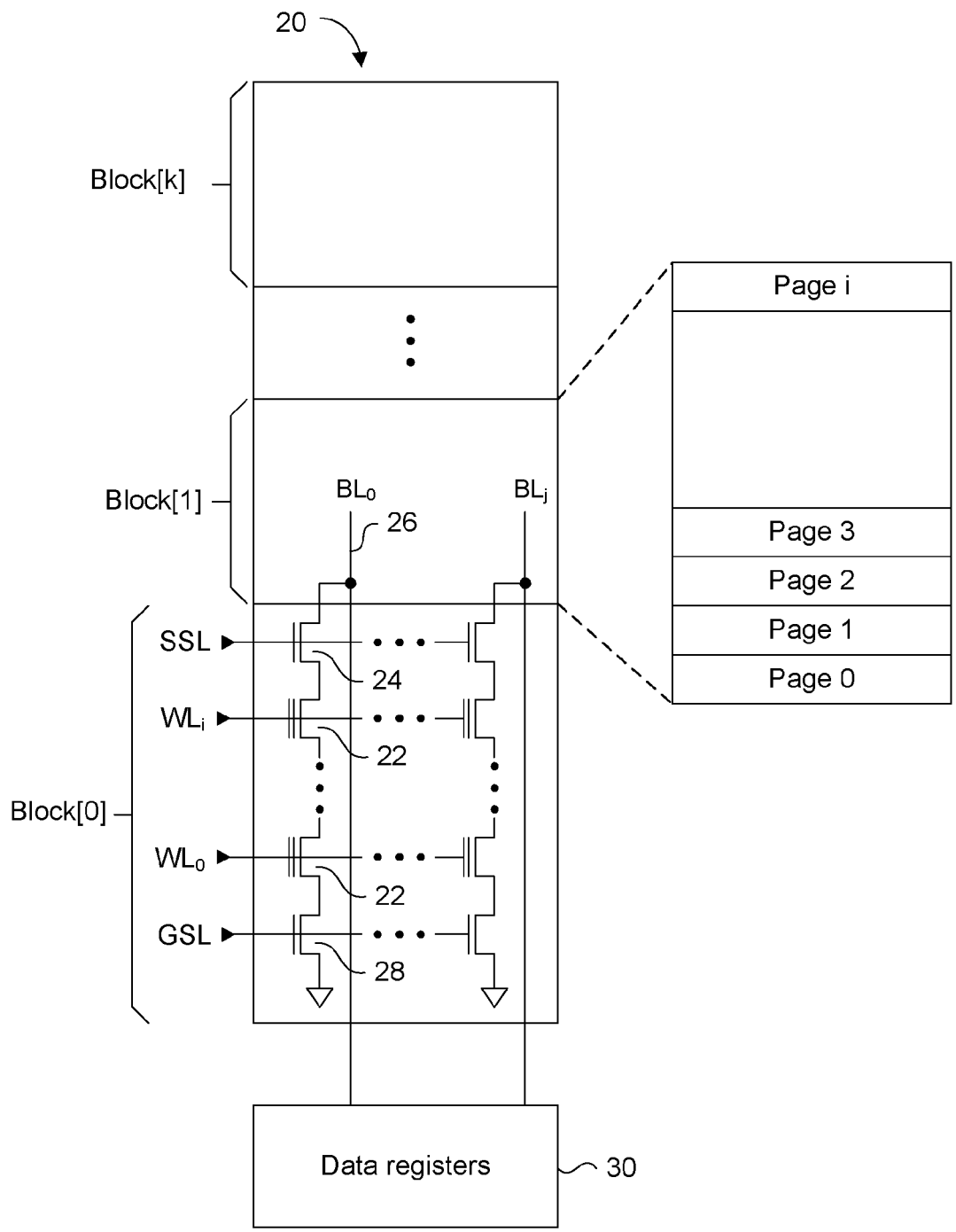
FIG. 2 is a diagram showing a physical arrangement of a memory array.
Figure 3:
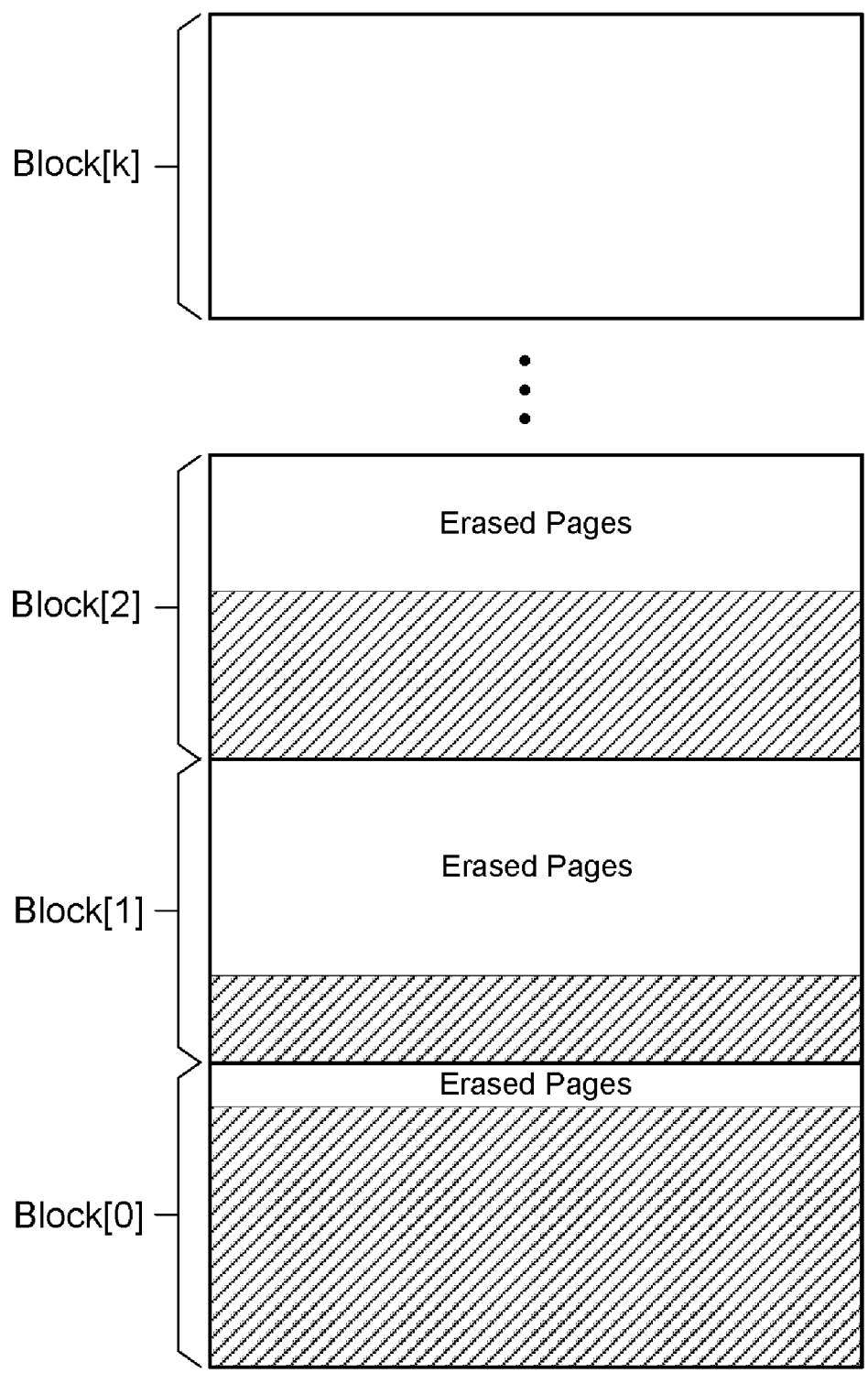
FIG. 3 is a conceptual illustration of partially erased physical memory block of a flash memory device.

FIG. 3 is a conceptual illustration of physical memory blocks (Block[0] to Block[k]) of a flash memory device, according to a present embodiment. Each physical block can have logical sub-blocks selectively erased, where the sub-blocks being erased can consist of any number of pages. In FIG. 3, portions of the memory blocks storing data are shown with cross-hatch lines, while erased sub-blocks of the memory blocks have no cross-hatching. The size of the sub-block being selectively erased can be preset to be any proportion of the physical block, or can be dynamically configurable on the fly. In the example of FIG. 3, Block[0] has a smaller erased sub-block than Block[1]. Depending on the physical block size, it may be convenient to divide the physical block into more than two logical sub-blocks, such as four logical sub-blocks for example. Hence, each physical block is partially erasable. It is assumed that the memory cells of each physical block are arranged in NAND memory cell strings, as shown in FIG. 2, and each page is programmed sequentially in the direction from $WL_0$ to $WL_i$, where $WL_i$ is the last wordline to be programmed.

In the present example where data is sequentially programmed from $WL_0$ to $WL_i$, there will be a lower sub-block and an upper sub-block. The lower sub-block will include a lower sequential set of wordlines, while the upper sub-block will include a higher sequential set of wordlines. In order to minimize program disturb, the upper sub-block of any memory block will be erased and reprogrammed while the data of the lower sub-blocks is retained. This scheme mimics the situation where a previously erased physical block is sequentially programmed up to a certain page, leaving the remaining pages in the erased state. Therefore, program disturb is minimized when data is later programmed sequentially to the erased upper sub-block. While a lower sub-block can be erased while data is retained in an adjacent upper sub-block, data should not be reprogrammed to the lower sub-block until the adjacent upper sub-block is erased.

Figure 4:
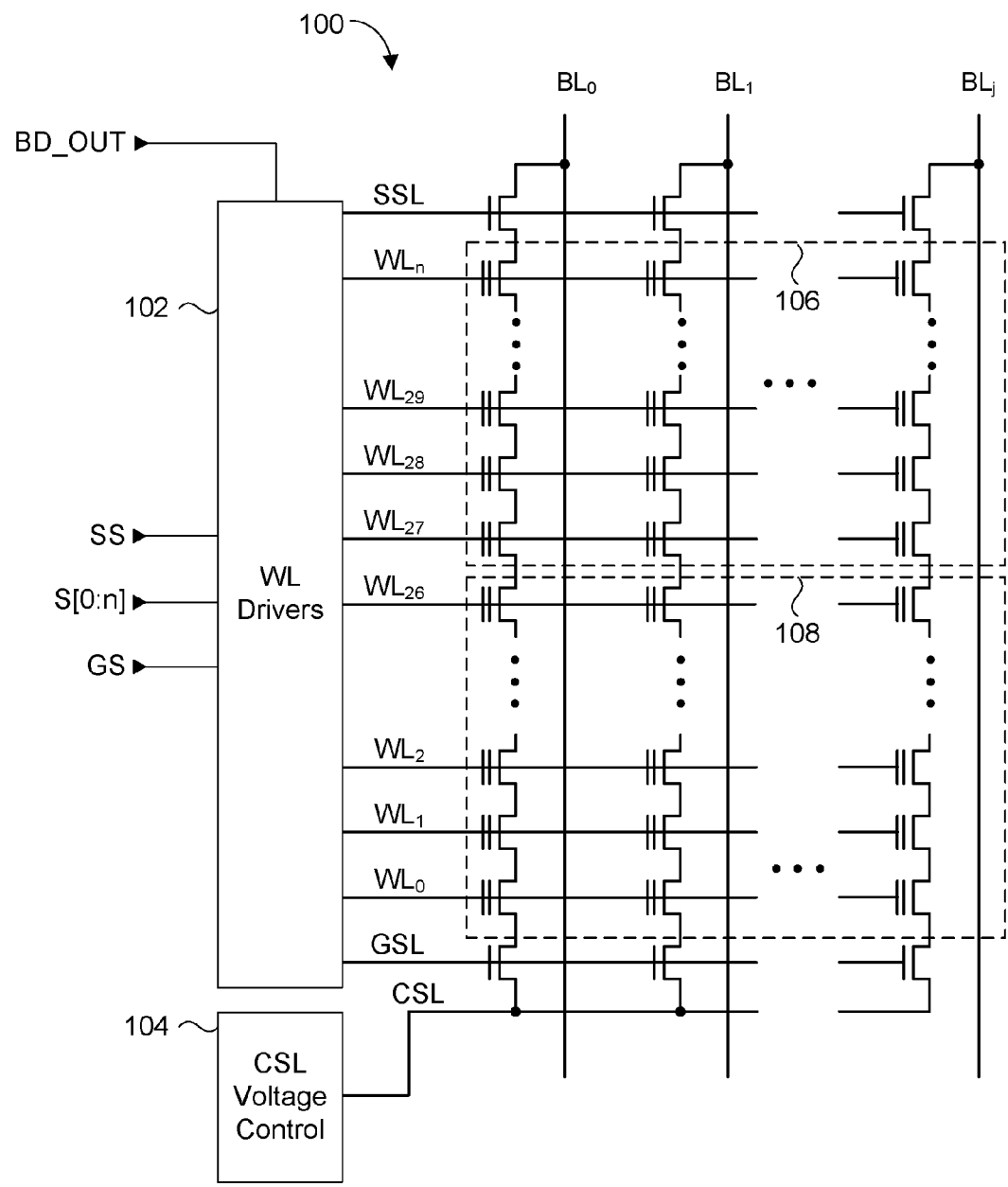
FIG. 4 is a circuit schematic showing circuit details of a physical memory block of a flash memory array.

Now that the general concept for partially erasing a physical block has been introduced, further detailed embodiments will be described with reference to FIG. 4. FIG. 4 is a circuit schematic showing a physical block 100 of a flash memory array, a wordline driver block 102 and a source line voltage control circuit 104. The wordline driver block 102 and source line voltage control circuit 104 are typically local to the physical block 100. Physical block 100 has NAND flash memory cell strings arranged in columns, where each string is coupled to a bitline, $BL_0$ to $BL_j$, and a common source line CSL. The wordline driver block 102 couples signal SS to the SSL control line, S[0:n] to the $WL_0$ to $WL_n$ wordlines respectively, and GS to GSL control line. Signals SS, S[0:n] and GSL are set to a different voltage levels during program, program verify, read, and erase operations, as is well known by those skilled in the art. The source line voltage control circuit 104 is responsible for setting the voltage level of CSL depending on one of the aforementioned operations being executed.

Following is an example scenario to illustrate the logical formation of an erasable sub-block of physical block 100. It is assumed that all pages ($WL_0$ to $WL_n$) of physical block 100 has been programmed with data in the direction from $WL_0$ to $WL_n$, and the data stored in the memory cells coupled to $WL_{27}$ to $WL_n$ is to be modified. Accordingly, the bitlines, wordlines $WL_{27}$ to $WL_n$, and the source line CSL are biased to erase only the data stored in the memory cells coupled to wordlines $WL_{27}$ to $WL_n$. Then the modified data is reprogrammed to the same wordlines. The pages corresponding to wordlines $WL_{27}$ to $WL_n$ are referred to as an upper sub-block 106 and the pages corresponding to $WL_0$ to $WL_{26}$ are referred to as a lower sub-block 108. The upper sub-block 106 is therefore dynamically configurable in size, since its size depends on the data being erased. Alternately, the size of the sub-block 106 and of sub-block 108 can be fixed.

The presently described embodiments are not limited to erase and reprogram of a sub-block, since data does not necessarily have to be reprogrammed after the sub-block is erased. This means that once a sub-block is erased in one operation, any number of sequential pages below the erased sub-block can be erased in a later operation, thereby extending the size of the erased sub-block.

As previously mentioned, specific pages of the physical block are erased by biasing the bitlines, selected and unselected wordlines, and the source line. Tables 1 and 2 provides example bias conditions effective for erasing a sub-block of pages in a selected physical block and bias conditions effective for inhibiting erasing in an unselected physical block.

TABLE 1

|  | Selected Block | Unselected Block |
| --- | --- | --- |
| Bitlines (B/L) | Clamped to Vers-0.6 V | Clamped to Vers-0.6 V |
| String Select Line (SSL) | Vers | Boosted to approx. 90% of Vers |
| Selected Wordline | 0 V | Boosted to approx. 90% of Vers |
| Unselected Wordline | Vers | Boosted to approx. 90% of Vers |
| Ground Select Line (GSL) | Vers | Boosted to approx. 90% of Vers |
| Common Source Line (CSL) | Clamped to Vers-0.6 V | Clamped to Vers-0.6 V |
| Substrate (Pocket P-Well) | Vers | Vers |

In the example of Table 1, unselected wordlines are biased to a positive voltage for preventing the corresponding unselected page(s) from being erased. This voltage is referred to as Vers. The selected wordlines are biased to another voltage for erasing the selected page(s), for example, 0V. With the substrate of the memory cells biased to a positive voltage, such as Vers, an electrical field between the memory cells biased to 0V and the substrate will be formed, which is effective for erasing the memory cells. The electrical field between the memory cells biased to Vers and the substrate will be insufficient for erasing the memory cells, therefore erasure is inhibited and data stored therein is retained.

To prevent erasure of memory cells in unselected blocks, all wordlines in the unselected blocks are left to float during erase operations. The floating wordlines in the unselected blocks are boosted to nearly the erase voltage Vers, which can be about 90% of Vers when the substrate of the cell array is biased to Vers, by capacitive coupling between the substrate and the wordlines when Vers is applied to the substrate. It is noted that the actual boosted voltage level on the floating wordlines is determined by the coupling ratio between the substrate and wordlines. The boosted voltage on the wordlines in unselected blocks reduces the electric field between the substrate and wordlines, thereby inhibiting erasure of the memory cells. Further details of wordline boosting in flash memory is described in commonly owned U.S. patent application Ser. No. 11/565,170 filed on Nov. 30, 2006, the contents of which are incorporated by reference.

TABLE 2

|  | Selected Block | Unselected Block |
| --- | --- | --- |
| Bitlines (B/L) | Clamped to Vers - 0.6 V | Clamped to Vers - 0.6 V |
| String Select Line (SSL) | Boosted to approx. 90% Vers | Boosted to approx. 90% Vers |
| Selected Wordline(s) | 0 V | Boosted to approx. 90% Vers |
| Unselected Wordline | Boosted to approx. 90% Vers | Boosted to approx. 90% Vers |
| Ground Select Line (GSL) | Boosted to approx. 90% Vers | Boosted to approx. 90% Vers |
| Common Source Line (CSL) | Clamped to Vers - 0.6 V | Clamped to Vers - 0.6 V |
| Substrate (Pocket P-Well) | Vers | Vers |

In the example of Table 2, the bias conditions are the same as those shown in Table 1, except that the unselected wordlines of the selected block are boosted to nearly the erase voltage Vers. In one embodiment, this boosted voltage is about 90% of Vers, which is achieved by precharging the memory cells through the bitlines and source line, and then boosting the wordlines through capacitive coupling to the substrate as it is raised to Vers. Once again, details of wordline boosting for inhibiting erase is described in detail in U.S. patent application Ser. No. 11/565,170. While the illustrated bias conditions shown in Tables 1 and 2 are examples only, those skilled in the art should understand that specific values will depend on the manufacturing process, materials used, and specific design of the memory cells.

Once a sub-block of a physical block has been erased, an optional procedure to be executed before data is reprogrammed, is an erase verify operation. The erase verify operation ensures that the erased cells have a threshold voltage proper threshold voltage margin. For example, the erase threshold voltage will be some negative voltage value. In traditional block erase architectures, erase verify is executed by biasing all the wordlines of the block to 0V, and sensing a current through the NAND memory cell strings. Any memory cell having at least one memory cell with an erase threshold voltage greater than 0V will not turn on, and the absence of a current in the corresponding bitlines will be sensed. This traditional scheme is not possible when some of the memory cells still retain data corresponding to one of many possible threshold voltages.

According to an embodiment, an erase verify operation for a partially erased block is executed by biasing the selected wordlines coupled to the erased memory cells to a voltage greater than the erase threshold voltage, and by biasing all remaining unselected wordlines to a voltage used for read operations. This voltage is referred to as Vread, and can range between 4-5V for example. Table 3 shows example bias conditions for performing an erase verify operation on a partially erased block.

TABLE 3

|  | Page Erase Verify with Source Bias |
| --- | --- |
| Bitlines (B/L) | Precharged and Sensed |
| String Select Line (SSL) | Vread (4~5 V) |
| Selected Wordlines | 0 V |
| Unselected Wordlines | Vread (4~5 V) |
| Ground Select Line (GSL) | Vread (4~5 V) |
| Common Source Line (CSL) | Vcs |
| Substrate (Pocket P-Well) | 0 V |

According to an embodiment, the voltage of the source line (Vcs) is adjustable relative to the number of wordlines that are being verified, in order to ensure that the negative threshold erase voltage is sufficiently spaced from 0V. For example, if the negative threshold erase voltage should be at least −0.5V, and erasing results in a threshold of −0.2V, then the wordline should be biased to −0.5V to detect the −0.2V threshold. However, since negative voltages may not be suitable for use in some devices, the source line Vcs is raised to a positive voltage level while the selected wordlines are biased to 0V. By biasing the Vcs positively, the selected wordline becomes effectively negative. Those skilled in the art should understand this effect.

Figure 5:
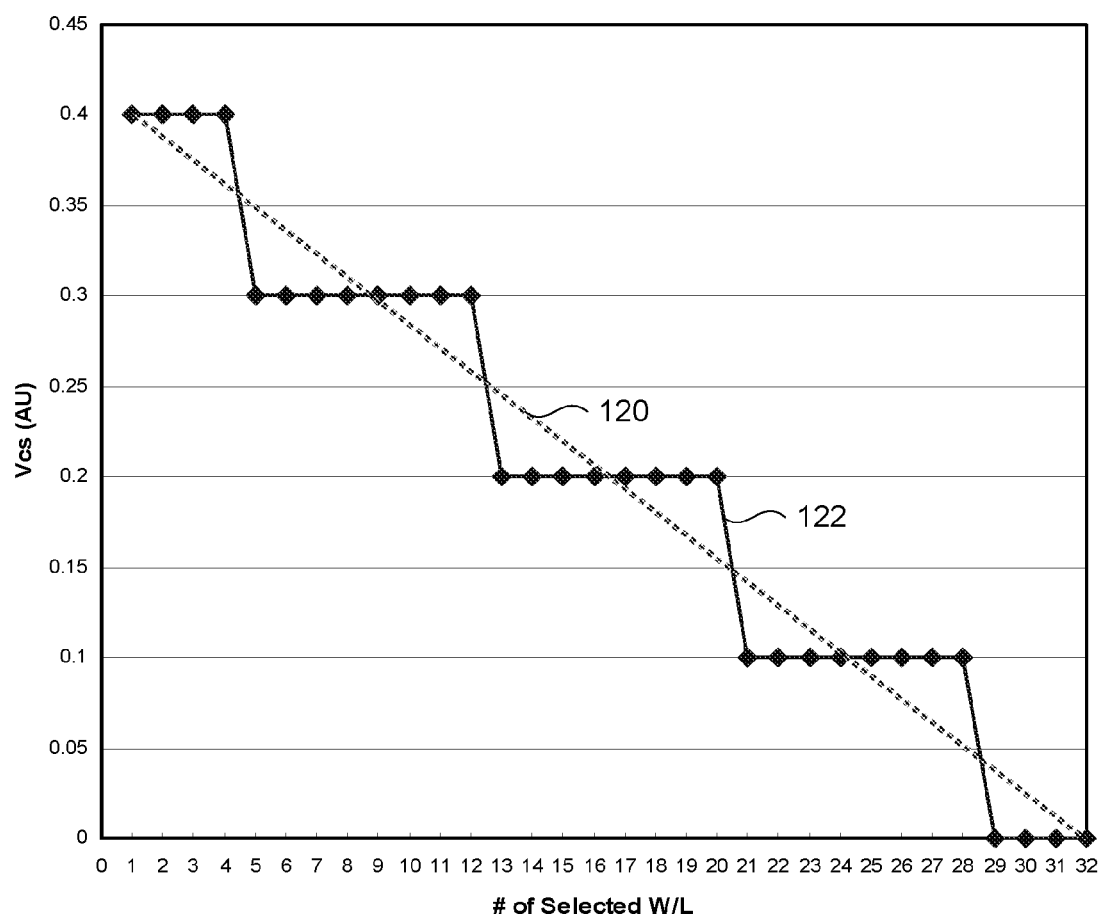
FIG. 5 is a graph illustrating the relationship between a source line voltage and the number of selected wordlines during an erase verify operation.

FIG. 5 shows the relationship between the number of selected wordlines corresponding to the erased sub-block being verified. The x-axis is the total number of wordlines to be verified while the y-axis is the voltage of common source line (Vcs). Diagonal curve 120 represents an ideal relationship between the voltage level of Vcs and the number of selected wordlines. It is clear that the Vcs voltage decreases as the number of selected wordlines to be verified increases. If only one wordline is to be verified, then Vcs can be set to a first voltage, such as 0.4V for example. On the other extreme, if all the wordlines are to be verified, then Vcs can be set to a second, smaller voltage of 0V. Therefore the range of Vcs in the presently shown embodiment can range between 0V and 0.4V. In alternate embodiments having more wordlines in each NAND memory cell string, a voltage higher than 0.4V may be used.

Although diagonal curve 120 is ideal, the fine control required to implement it in at least some examples is impractical. However, stepped voltages for groupings of selected wordlines can be practically implemented in source line voltage control circuit 104, as should be understood by those skilled in the art. Stepped curve 122 illustrates one example of the step sizes and wordline groupings that is possible. The selection of the first voltage, second voltage, size of wordline groupings and voltage step size between groupings, will be based on the design parameters of the flash memory device.

Figure 6:
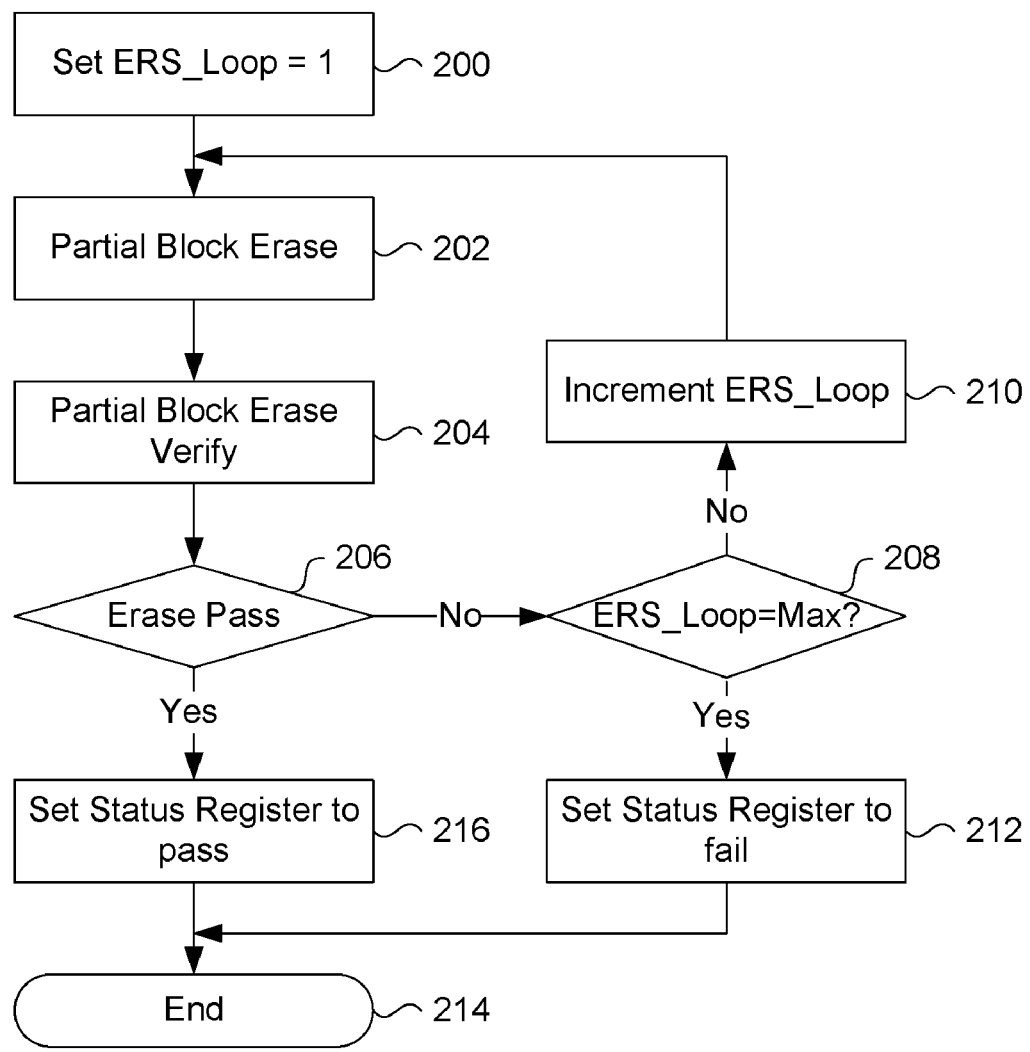
FIG. 6 is a flow chart of a method for partial block erase and erase verify.

A partial block erase and erase verify method embodiment will now be described with reference to FIG. 6. The method of FIG. 6 can be executed for each partial block erase operation. The method begins at step 200 by setting an erase loop counter variable, called ERS_LOOP equal to 1, or any desired starting value. At step 202, a partial block erase operation is executed for erasing at least one memory cell in a NAND memory cell string. This step will include receiving a partial erase instruction, receiving address(es) corresponding to the memory cell(s) to be erased, biasing of the selected wordline (s), the unselected wordline(s), bitlines and other relevant signals to levels sufficient for erasing the memory cells coupled to the selected wordlines. Previously shown Tables 1 and 2 list example bias values that can be used.

Now, the erase verify sequence begins at step 204 after a sub-block of a physical block has been partially erased. This step will include setting of the appropriate Vcs level based on the number of selected wordlines, and biasing the selected and the unselected wordlines with the appropriate voltages for sensing the erased state of the memory cells coupled to the selected wordlines. Previously shown Table 3 lists example bias values that can be used. The bitline is precharged and sensing of the bitline is initiated. At step 206, sensing is completed and the result will indicate that the partial erase operation was either successful or not. For example, by biasing the selected wordlines to 0V and biasing the unselected wordlines, SSL and GSL to Vread, the corresponding bitline precharged to a high voltage level will discharge to Vcs if all the memory cells coupled to the selected wordlines have a threshold voltage less than 0V, thereby passing the test. However, if at least one memory cell coupled to the selected wordlines has a higher than 0V threshold, then the bitline will not be discharged to Vcs, thereby failing the test. Either case can be detected by bitline sense amplifier circuits, as should be well known to those skilled in the art.

If the test is failed, then the method proceeds to step 208 where the counter variable ERS_LOOP is compared to a maximum value, Max. If the current loop counter is less than Max, then the ERS_LOOP is incremented at step 210. From step 210, the method returns to step 202 and the partial erase of the selected sub-block is repeated. Partial erase and verify steps 202, 204, 206, 208 and 210 will continue until one of two conditions is met. The first condition occurs if counter variable ERS_LOOP reaches the maximum value Max, then the method proceeds to step 212 where the status register is updated to reflect a failed erase status. Alternately, all the pages corresponding to the sub-block are mapped out from further use. Then the method ends at step 214. The second condition occurs if the test is passed, then the method proceeds from step 206 to step 216 where the status registers are updated to reflect a passed erase status. This sub-block is then ready to be programmed with new data.

In summary, the partial erase concept has been generally described with reference to the embodiments shown in FIGS. 3 to 6. By partially erasing a memory block, the flash memory device can create smaller subdivisions within the memory block, referred to as sub-blocks. Data occupying a sub-block can be modified without having to erase the entire memory block, thereby conserving program/erase cycles and increasing the life-span of the memory block. The following description discusses how a particular sub-block is selected to be erased.

Figure 7A:
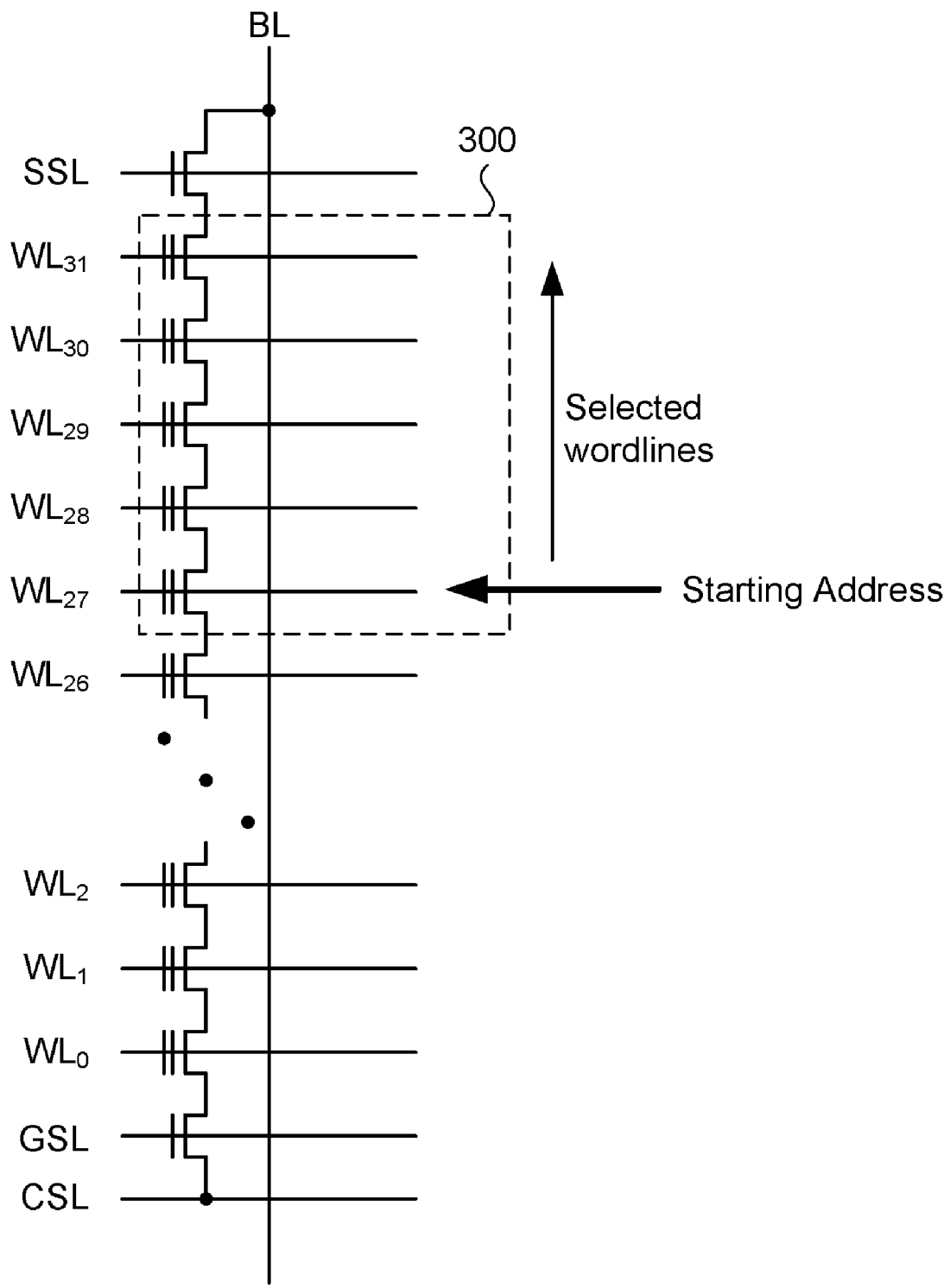
FIGS. 7a, 7b and 7c are circuit schematics of a NAND memory cell string illustrating examples of selectively erasable sub-blocks.
Figure 7B:
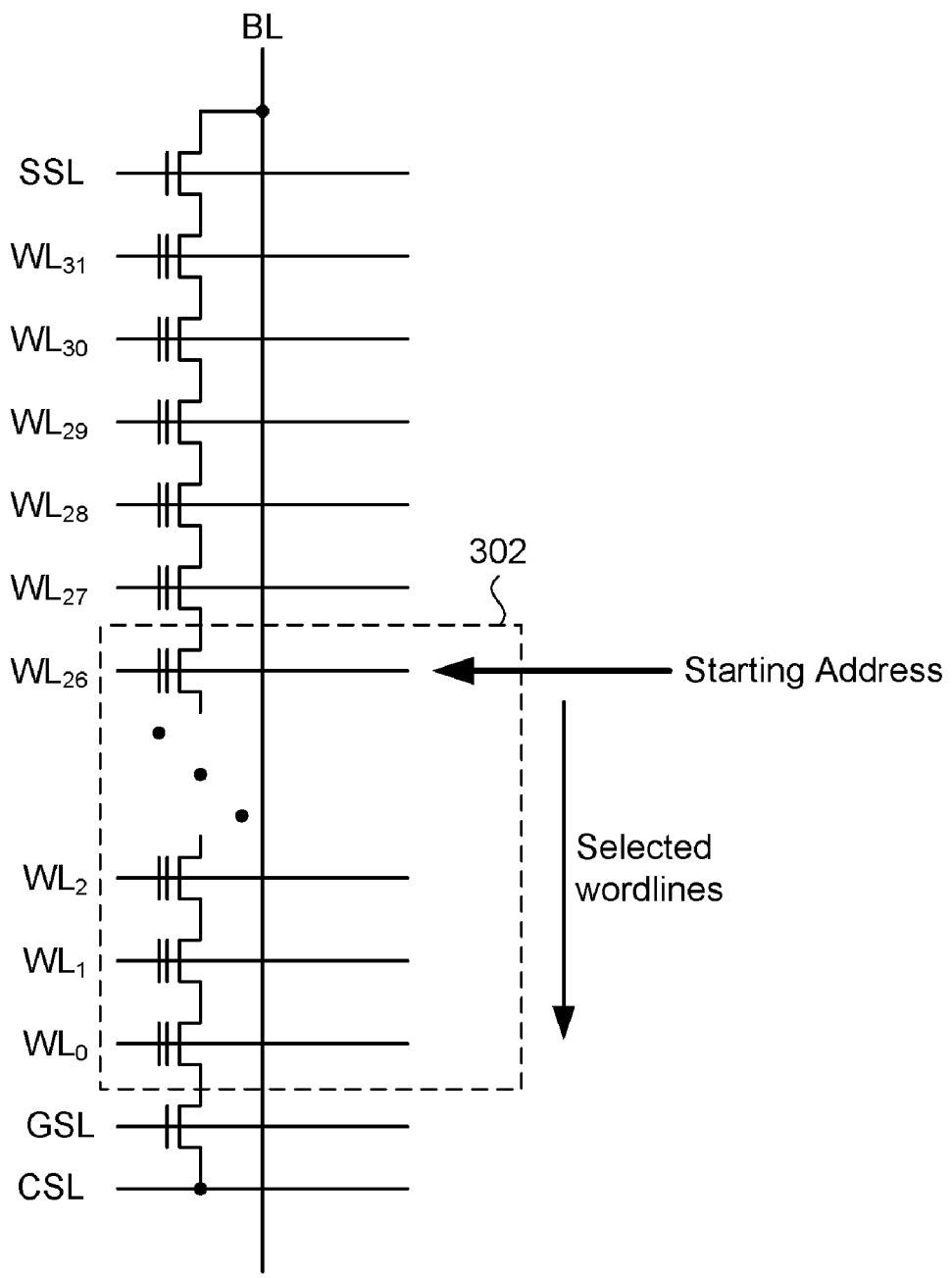
Figure 7C:
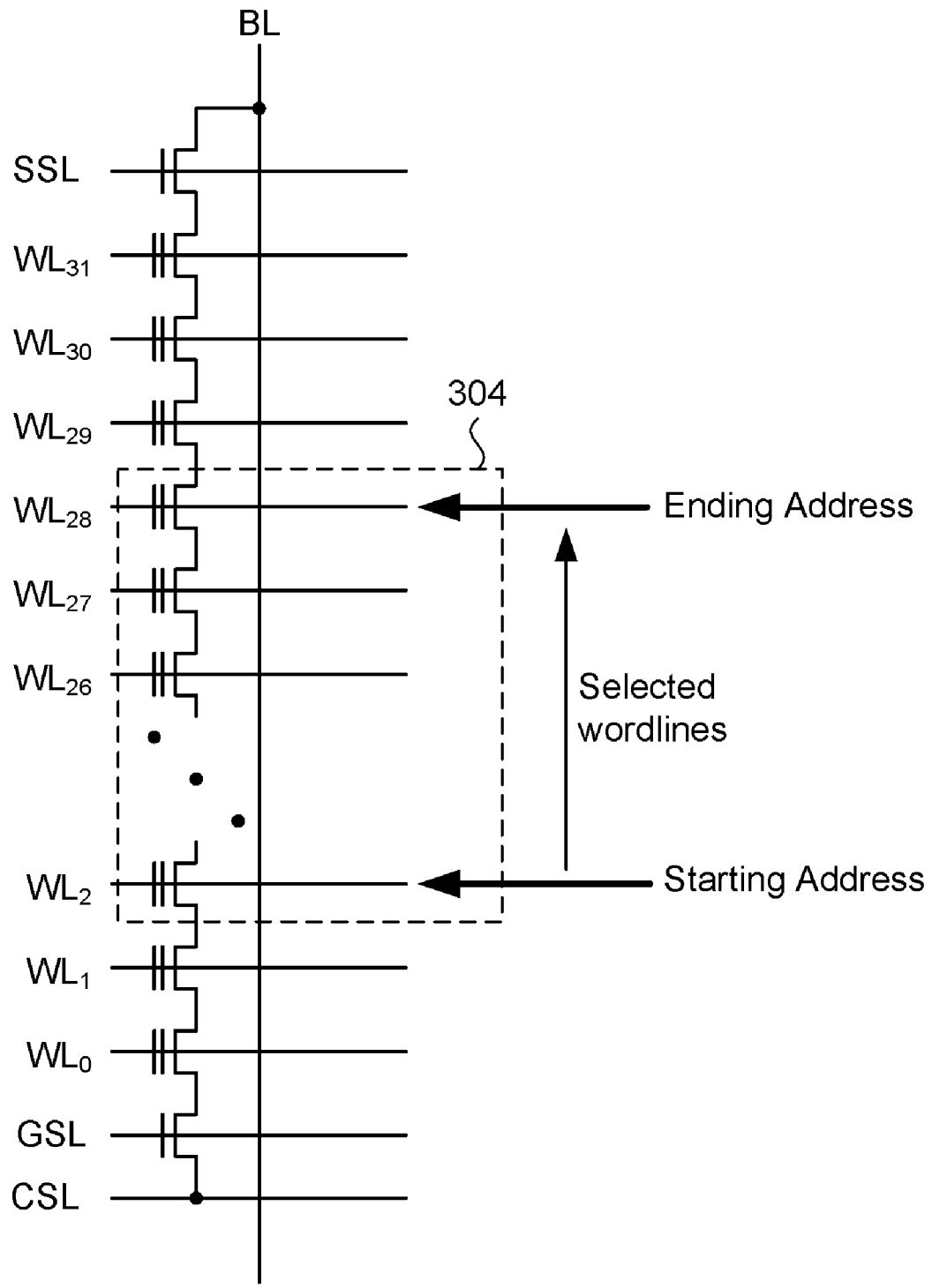

When any sub-block of the memory block is to be erased, the flash memory device will require information about its location within the memory block, so that it will know which rows (wordlines) to select for application of the bias voltages for effecting erasure of the memory cells coupled thereto. FIGS. 7a to 7c illustrate three possible size/locations of an erasable sub-block within a memory block.

FIG. 7a is a circuit schematic of a NAND memory cell string that is programmed in sequence starting from $WL_0$ up to WL31. In this embodiment, the flash memory device only requires one wordline address as the starting address. Once the starting address is received, the logic of the flash memory device will automatically set the sub-block size to be from the starting address up to the last wordline, WL31 in this example. To illustrate with reference to FIG. 7a, if the starting address corresponding to $WL_{27}$ is received for a partial erase operation, then the logic of the flash memory device will decide that the sub-block 300 will start at $WL_{27}$ and end at $WL_{31}$. In other words, the end address is preset to be $WL_{31}$ regardless of the starting address that is provided. Once the set of wordlines for the sub-block 300 is determined, then the partial erase and erase verify procedures can be executed by biasing the selected and unselected wordlines. Sub-block 300 is an upper sub-block, where an upper sub-block is any grouping of wordlines including the last wordline to be sequentially programmed.

FIG. 7b is a circuit schematic of the NAND memory cell string of FIG. 7a. Similar to the embodiment of FIG. 7a, only one starting row address is required for a partial erase operation. In this embodiment, the logic of the flash memory device will automatically set the sub-block size to be from the starting address down to the first wordline, $WL_0$. To illustrate with reference to FIG. 7b, if the starting address corresponding to $WL_{26}$ is received for a partial erase operation, then the logic of the flash memory device will decide that the sub-block 302 will start at $WL_{26}$ and end at $WL_0$. The end address is preset to be $WL_0$ regardless of the starting address that is provided. Sub-block 302 is a lower sub-block, where a lower sub-block is any grouping of wordlines including the first wordline to be sequentially programmed.

Both the embodiments of FIGS. 7a and 7b will subdivide one memory block into a lower sub-block and an upper sub-block. However, if one sub-block is erased and only partially re-programmed with data, there will be pages still in the erased state. Further erasing of the original sub-block will subject the erased pages to further erase operations, which is undesired. Therefore, a sub-block slice can be selected, as shown in the embodiment of FIG. 7c.

FIG. 7c is a circuit schematic of the NAND memory cell string of FIG. 7a. Now, a starting address and an ending address defines the sub-block position and size within the memory block. In this embodiment, the logic of the flash memory device will automatically set the sub-block size to be from the starting address up to the ending address. To illustrate with reference to FIG. 7c, if the starting address corresponding to $WL_2$ and an ending address corresponding to $WL_{28}$ is received for a partial erase operation, then the logic of the flash memory device will decide that the sub-block slice 304 will start at $WL_2$ and end at $WL_{28}$. A sub-block slice is any grouping of wordlines positioned between other wordlines of the NAND memory cell string. To minimize program disturb, sub-block slice 304 can be repeatedly erased and programmed provided pages corresponding to $WL_{29}$ to $WL_{31}$ are erased, even if there is data stored in pages corresponding to $WL_0$ and $WL_1$.

As shown in FIGS. 7a-7c, at least one address is used for erasing an upper or a lower sub-block, while two addresses are used for erasing a sub-block slice. According to an embodiment, a command protocol is provided to allow a flash memory controller to interface with the flash memory device and initiate erasing of an upper sub-block, a lower sub-block or a sub-block slice. Those skilled in the art will understand that one or more flash memory devices can be controlled by a single flash memory controller, which acts as an interface between the flash memory device(s) and the host system, such as a computer.

Figure 1:
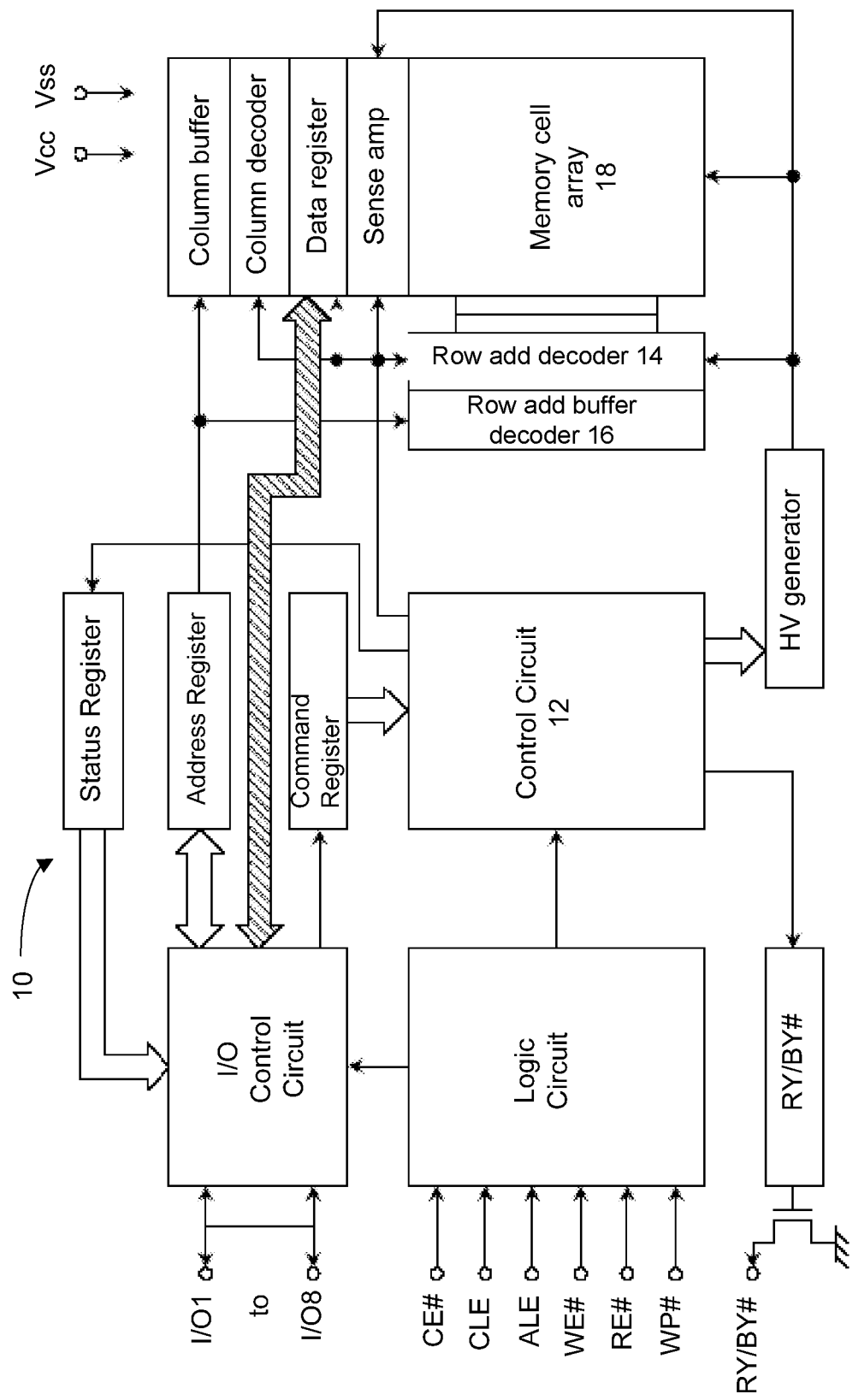
FIG. 1 is a block diagram of typical flash memory of the prior art.
Figure 8:
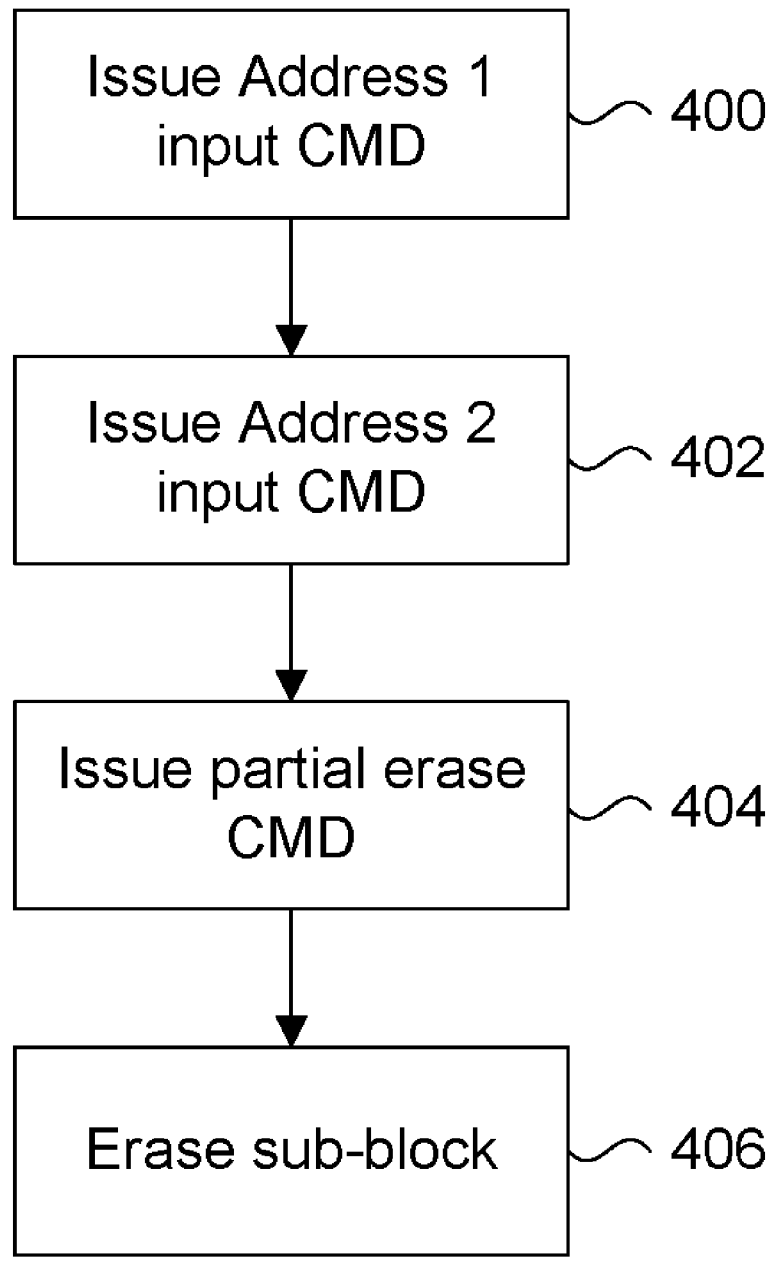
FIG. 8 is a flow chart illustrating a command protocol for erasing a sub-block of a memory block.

FIG. 8 is a flow chart illustrating a command protocol embodiment for erasing a sub-block of a memory block. It is assumed that the flash memory control logic, which may be implemented in control circuit 12 of FIG. 1, is configured for responding to the present command protocol. To execute a partial erase operation upon a memory block, the flash memory controller first issues an address input command including a first address at step 400. Following at step 402, the flash memory controller issues another address input command including a second address. As will be described in further detail later, the first or the second address can be a null address value. A partial erase command is issued at step 404, and depending on the first and second addresses that were previously received, an upper sub-block, a lower sub-block, or a sub-block slice is erased at step 406. Erasing at step 406 includes biasing the wordlines, bitlines and source lines to their appropriate voltage levels.

In this command protocol example, three address combinations are allowed. In a first case, when the first address is valid and the second address is null, the control logic will select an upper sub-block bound by and including the wordline corresponding to the first address (referred to as an intermediate wordline between the first and last wordline of the NAND memory cell chain) to the last wordline of the NAND memory cell string, ie. $WL_{31}$ in the present example. In a second case, when the first address is null and the second address is valid, the control logic will select a lower sub-block bound by and including the intermediate wordline corresponding to the second address to the first wordline of the NAND memory cell string, ie. $WL_0$ in the present example. In a third case, when the first and second addresses are valid, the control logic will select a sub-block slice bound by and including the wordlines corresponding to the first and second addresses. Those skilled in the art will appreciate that the three situations listed above represents one possible protocol configuration. In one alternate configuration, the first case will result in a selection of a lower sub-block while the second case will result in a selection of an upper sub-block. In yet another alternate embodiment, the partial erase command can be issued before either the first and second input address commands are issued.

Figure 9:
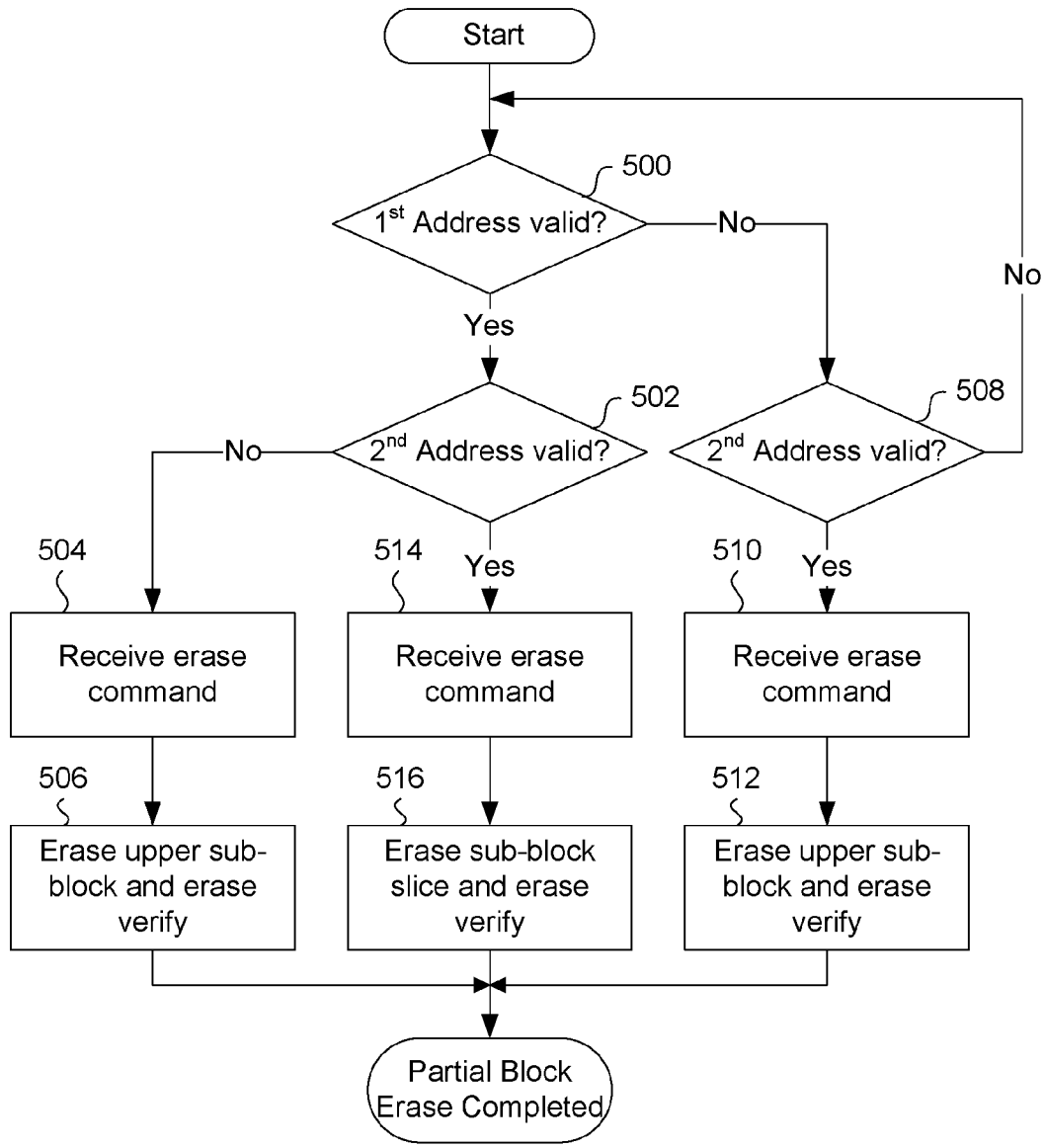
FIG. 9 is a flow chart of a method for erasing either an upper sub-block, a lower sub-block, or a sub-block slice using the command protocol shown in FIG. 8.

FIG. 9 is a flow chart of a specific method embodiment for erasing either an upper sub-block, a lower sub-block, or a sub-block slice using the command protocol shown in FIG. 8. More specifically, one of an upper sub-block, a lower sub-block, and a sub-block slice is erased based on the presence or absence of a first or second valid address received with the first input address command and the second input address command. For the purposes of the following description, it is assumed that the flash controller is configured for issuing a partial erase command for erasing sub-blocks of memory blocks of a flash memory device, and that the flash memory device includes the control logic for biasing the wordlines, bitlines and other signals for partial erase and erase verify operations.

The method of FIG. 9 illustrates the logical operation of the flash memory device control logic in response to address input commands and an erase command, according to the command protocol of FIG. 8. The method of FIG. 9 begins at step 500, where a first address input command is received. This address input command will include either a first valid address corresponding to a wordline of the NAND memory cell string of the memory block, or a null address. In the first case, the first address is valid and the method proceeds to step 502, where a second address input command is received with a second address. The second address can be a valid address corresponding to a different wordline of the NAND memory cell string, or a null address. Continuing with the first case, the second address is the null address and the method proceeds to step 504. At step 504 a partial erase command is received and the upper sub-block is erased and verified at step 506. Step 504 includes appropriate biasing of the wordlines, bitlines and other relevant signals for erasing the upper sub-block and erase verifying the upper sub-block.

Returning to step 500, if the first address is the null address instead of a valid address, the method proceeds to step 508, which is the same as step 502. If the second address is also a null address, then the partial erase method ends and returns to step 500. On the other hand, if the second address is a valid address, then case 2 occurs. Once a partial erase command is received at step 510, a lower sub-block is erased and verified at step 512. Step 512 includes appropriate biasing of the wordlines, bitlines and other relevant signals for erasing the low sub-block and erase verifying the lower sub-block. Returning to step 502, if the first address from step 500 is valid and the second address is valid, then case 3 occurs. The method then proceeds to step 514 where the partial erase command is received. Then a sub-block slice is erased and verified at step 516. Step 516 includes appropriate biasing of the wordlines, bitlines and other relevant signals for erasing the sub-block slice and erase verifying the sub-block slice.

While the command protocol does not require a second valid address for case 1 or a first valid address for case 2, the command protocol can be configured to accept valid second and first addresses for cases 1 and 2 respectively. For example, to erase an upper sub-block, the first address will correspond to an intermediate wordline while the second valid address corresponds to the last wordline $WL_{31}$, for example. Similarly, to erase a lower sub-block, the first address will correspond to the first wordline $WL_0$, while the second valid address corresponds to an intermediate wordline.

Therefore, by using the command protocol and method shown in FIGS. 8 and 9, any arbitrary sub-block of a memory block can be repeatedly erased and re-programmed with data without impacting the program erase cycle lifespan of the other sub-block or sub-blocks of the memory array. Any flash memory device or flash memory system having one or more flash memory devices, configured for erasing arbitrary sub-blocks can be controlled to execute wear leveling algorithms for maximizing the lifespan of memory blocks, thereby maximizing the lifespan of the flash memory device. A flash memory device operating without a wear leveling algorithm will program data sequentially from a first memory block to a last memory block, filling each memory block before programming the next one. Uneven wear will result if the system continuously programs and erases data in the first memory block, leaving the other memory blocks unused.

Wear leveling is a scheme for ensuring even use of all the memory of a flash memory device. More specifically, wear leveling ensures that all the memory blocks experience substantially the same number of program cycles or erase cycles. Those skilled in the art will understand that flash memory cells can be programmed/erased a finite number of times before data is no longer reliably stored. A flash controller tracks the total number of program/erase cycles experienced by each memory block or page of the memory block. The number of cycles is stored in a spare field of each page of the memory array. The flash controller will map a logical address location of data to a physical address where the data is stored in the flash memory device. When a memory block has reached a maximum predetermined number of program/erase cycles, the flash controller will instruct the flash memory device to reprogram the data stored in the memory block to an available memory block, and then maps out the original memory block from further use (now called an invalid block). The mapping is then adjusted accordingly.

Presently known wear leveling techniques employ logical to physical mapping techniques for programming data across different memory blocks. For example, a large data file to be programmed can have a first portion programmed to a first block, a second portion programmed to a second block, and so forth. In another example, multiple data files totaling less than the size of one memory block can be each programmed to different memory blocks. Hence, if a specific portion of the large data file, or a specific small data file is to be modified, only the corresponding memory block storing it would be subjected to a program/erase cycle. The problem with all these schemes is that modifying a small data file or a portion of a data file residing in a memory block requires erasing the entire memory block. Therefore, the other data stored in the memory block will also be erased, and unnecessarily reprogrammed as the modified data is reprogrammed. This is a primary factor that will contribute to a reduction in the lifespan of the memory blocks.

In the previously described example embodiments, the sub-block to be erased was an arbitrary size, determined by the data in the memory block to be erased or modified. Modifying the data of the sub-block can be done by erasing the sub-block and reprogramming it with the modified data. However, this may subject the sub-block to too many program/erase cycles, thereby prematurely decreasing its lifespan relative to unused sub-blocks. Therefore, according to another embodiment, a wear leveling algorithm taking advantage of erasable sub-blocks to minimize unnecessary program/erase cycles is provided.

Figure 10A:
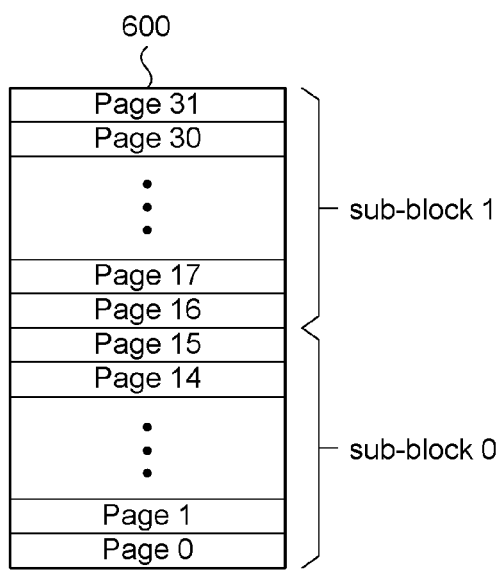
FIGS. 10a and 10b are schematics of memory blocks with different logical sub-block configurations.
Figure 10B:
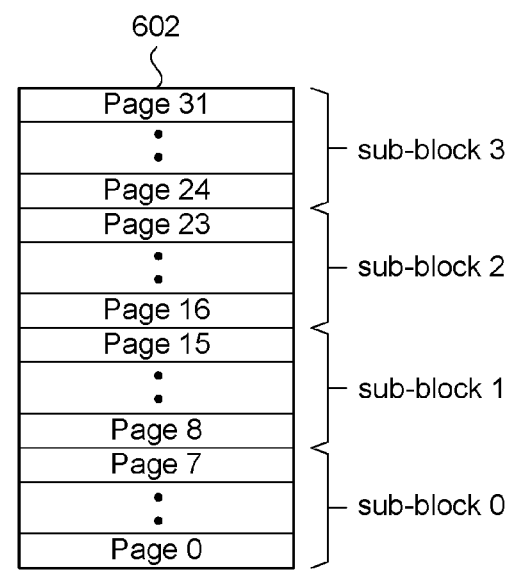

The present wear leveling algorithm will have the memory blocks of the flash memory device to be logically divided into predetermined sub-blocks. FIG. 10a illustrates an example where a memory block 600 is divided into two equally sized sub-blocks, sub-block 0 and sub-block 1. Sub-block 0 consists of pages 0 to 15 while sub-block 1 consists of pages 16 to 31. It is assumed that the memory block is programmed sequentially from page 0 to page 31, where each page corresponds to a specific wordline. FIG. 10b illustrates an example where a memory block 602 is divided into four equally sized sub-blocks, sub-block 0, sub-block 1, sub-block 2 and sub-block 3. Alternately, the sub-blocks of the memory blocks 600 and 602 do not necessarily have to be divided into equal sizes, and thus can have different predetermined sizes. Once the logical sub-blocks are determined, data can be programmed according to the wear leveling algorithm.

As previously discussed, a NAND memory cell string sequentially programmed with data from $WL_0$ to $WL_{31}$ (or alternately from $WL_{31}$ to $WL_0$) will experience minimum program disturb provided there is no data in the pages above the sub-block to be programmed. In the present example, a page above the sub-block will correspond to a wordline having a higher number. Accordingly in the example of FIG. 10a, sub-block 0 is referred to as a lower sub-block while sub-block 1 is referred to as an upper sub-block. In the wear leveling algorithm of the present embodiment, data will not be programmed to a lower sub-block if there is data residing in an upper sub-block. The flash memory controller will know that there is data in an upper sub-block by referring to the address mapping table which can include one or more validity bits loaded from the spare field of each page of the lower sub-block. A specific logic state of the validity bits will indicate to the flash memory controller whether or not the lower sub-block can be programmed. Alternately, the validity bits of the spare field corresponding to the upper sub-block will indicate that data will not be programmed to the lower sub-block. In the example of FIG. 10b, a sub-block of a pair of adjacent sub-blocks having a higher number is an upper sub-block while the other having a smaller number is a lower sub-block. In a memory block configured to have more than two sub-blocks as shown in FIG. 10b, sub-block 0 is the lowest ranking sub-block while sub-block 3 is the highest ranking sub-block and data will not be programmed to a sub-block if there is data stored in any sub-block having a higher ranking.

Figure 11:
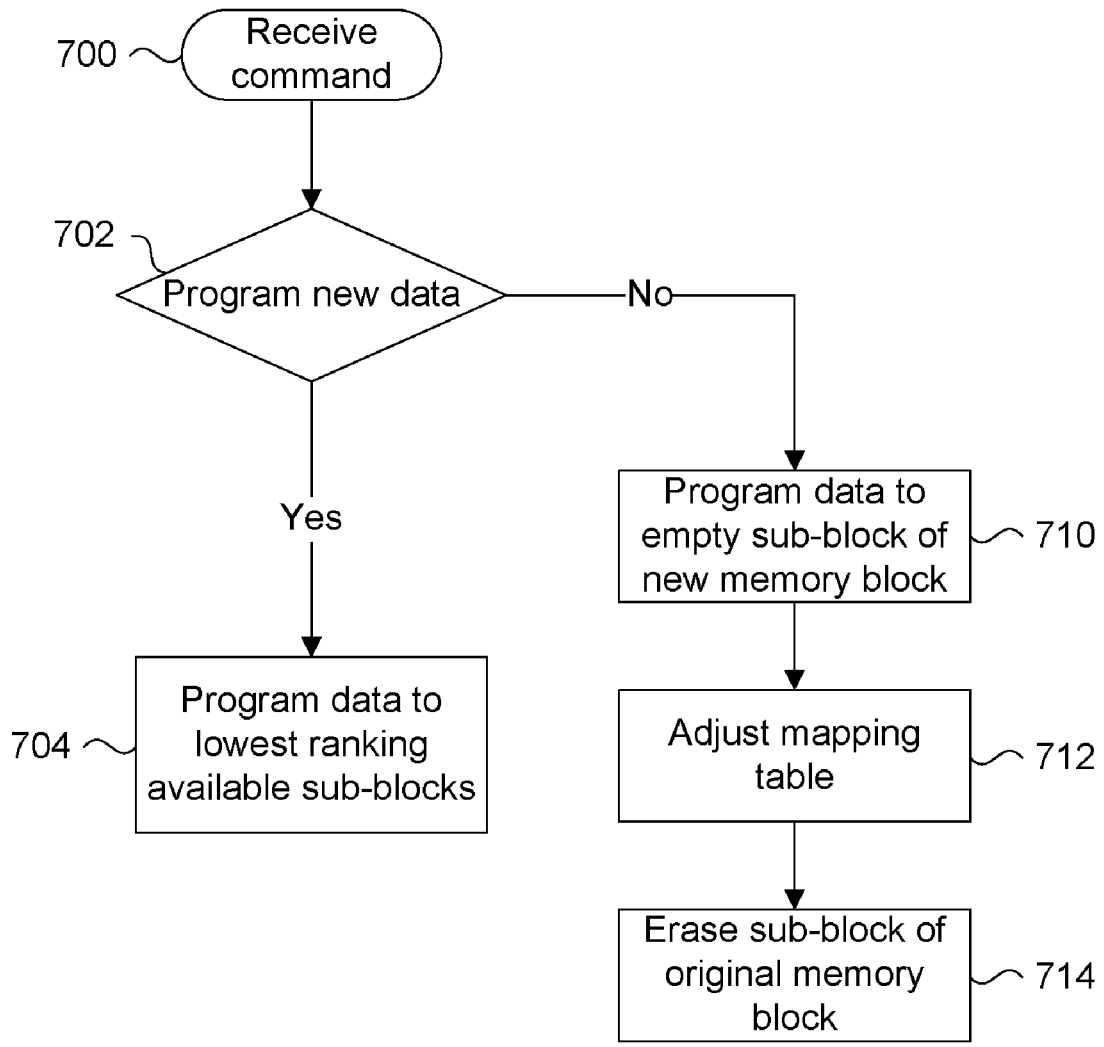
FIG. 11 is a flow chart of a wear leveling algorithm.

The wear leveling algorithm of the present embodiment shown in FIG. 11 will include a data programming sub-routine for programming new data to the flash memory device and a data modification sub-routine for re-programming modified data to the flash memory device. Both sub-routines ensure that the sub-blocks of the flash memory device are evenly used. The wear leveling algorithm is executed by the flash memory controller for a flash memory device configured for erasing sub-blocks of predetermined sizes, and begins at step 700 by receiving a command from the host system. At step 702, the flash memory controller determines if the command is to program new data or to modify currently programmed data. If the command is to program new data, the method proceeds to step 704 where the data is programmed to the lowest ranking available sub-block. For example, if the flash memory device consists of four empty memory blocks, each logically divided into two sub-blocks (sub-block 0 and sub-block 1) as shown in FIG. 10a, then data is successively programmed to sub-block 0 of every memory block. Eventually, all sub-block 0's will store data, and the next data to be programmed will be programmed to the first available sub-block 1.

By programming new data to the lowest available sub-blocks first, all the memory blocks will be used. However, step 704 can be replaced with an alternate data programming scheme. In this alternate scheme, programming new data will be based on a high or low priority level of the data to be programmed. The host system may decide that music files and executable applications with the appropriate file extensions are high priority, while data files such as text documents that are frequently modified, are low priority. The designation of data as high or low priority can be arbitrarily set by the host system.

In the alternate data programming embodiment, step 704 is replaced with a determination step for the priority level of the data. If the data is designated as high priority, it is programmed to the lowest available ranking sub-block of a memory block, since a high priority data file is less likely to be modified over time. If the lowest available ranking lower sub-block is too small to store the data, then the high priority data can be divided and distributed across two or more lowest ranking available sub-blocks of different memory blocks. Alternately, the data can be programmed to any number of adjacent lowest ranking available sub-blocks within the same memory block. If the data is designated as low priority, it is programmed to the highest available ranking sub-block of a memory block, since a low priority data file is more likely to be modified over time. If the sub-block is too small, then the data can be distributed in the same manner as previously described for the high priority data.

Returning to step 702, if the command is for modifying previously programmed data, the method proceeds to step 710. Since the previously programmed data resides in a sub-block of a memory block, that sub-block can be erased and reprogrammed with the modified data. If the sub-block included other data files, then they are re-programmed at the same time. However, the sub-block erase operation that must be executed before re-programming will slow performance of the flash memory device, and will subject the sub-block to a program/erase cycle. To overcome both problems, the modified data of the original sub-block is programmed to another sub-block in a different memory block at step 710. The original address mapping table maintained by the flash memory controller is then adjusted at step 712 to indicate that the data stored in the sub-block of the original memory block is now physically located in the sub-block of a new memory block. Later when the system is idle, the sub-block where the data was originally stored is erased at step 714, and this erased sub-block is marked as erased and available for storing data. The step of erasing can follow the method previously described in FIG. 9. By erasing the sub-block later, programming performance is maximized.

Re-programming the modified data in step 710 is further managed by a free sub-block allocator sub-routine. This sub-routine will identify the most appropriate sub-block to re-program the data to, based on the status of the other memory blocks of the flash memory device. The sub-block allocator sub-routine embodiment will re-program data of a sub-block to a sub-block in another memory block, with a priority to first re-program the data to a matching physical sub-block (ie. same sub-block ranking). If a matching physical sub-block is unavailable, then the data is re-programmed to the next most suitable physical sub-block. The purpose of matching sub-blocks is to maintain, as much as possible, the distribution of high and low priority data according to the selective data distribution algorithm described in FIG. 11 so that low priority data is programmed to higher ranking sub-blocks. The sub-block allocator sub-routine method will be described with reference to the flow chart of FIG. 12, and the graphical illustration of an original memory block and a new memory block in FIGS. 13*a* to 13*d*.

Figure 12:
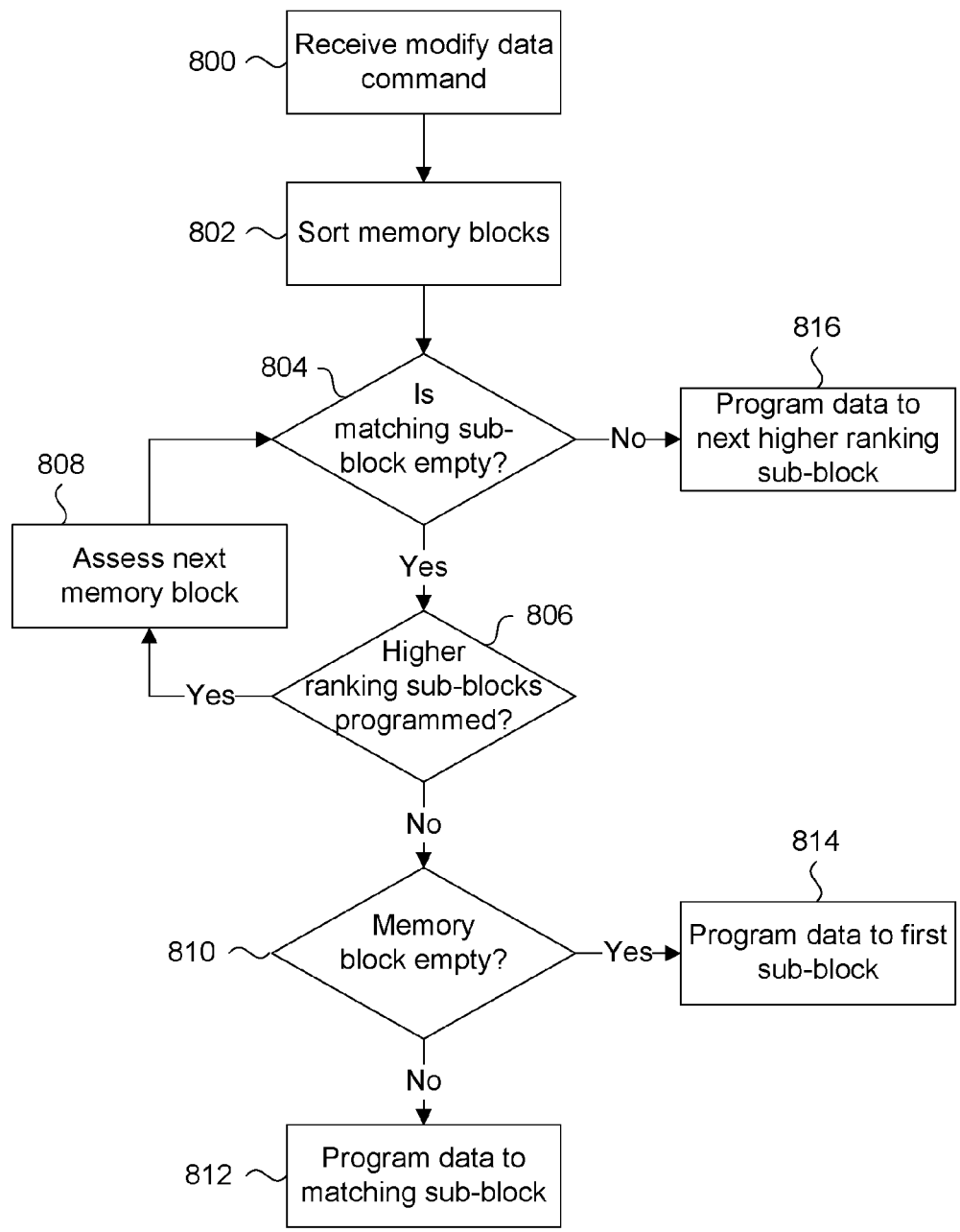
FIG. 12 is a sub-block allocator sub-routine of the wear leveling algorithm shown in FIG. 11.

The method of FIG. 12 starts when a command for modifying data is received at step 800. The command will include information pertaining to the address location of the sub-block of the original memory block that the data to be modified currently resides within. At step 802, the other memory blocks are logically sorted according to a predetermined ordering scheme to determine the sequence of memory blocks to assess. For example, the simplest scheme is to set the order based on the assigned physical/logical position of the memory blocks. A second scheme is to set the order based on the occupancy rate of the memory blocks, for example from fully empty blocks to fully programmed blocks or vice versa. A third scheme is to set the order based on the memory blocks with the least number of program/erase cycles. The second and third schemes can be implemented by scanning the address mapping table of the memory blocks, which will indicate the sub-blocks that are empty and the number of program/erase cycles of each page or memory block. This logical sorting can be dynamically maintained as data is programmed and erased from the memory blocks.

Then the method will assess the first new memory block in the logically sorted list of memory blocks and determine if the data should be re-programmed to it. At step 804 the method checks if the new memory block has an available matching physical sub-block, ie. a sub-block of the same ranking that is erased. If one is present in the new memory block, then the system checks if there are any sub-blocks of higher ranking than the sub-block presently storing the original data at step 806. To minimize program disturb, the data is not re-programmed to the matching physical sub-block when there are higher ranking sub-blocks with data stored therein. If a higher ranking sub-block with data exists, then the method assesses the next memory block in step 808 and returns to step 804. Otherwise, the other sub-blocks storing data are of lower ranking, and the method proceeds to step 810 to determine if the new memory block is empty. If the memory block is not empty, then there is data programmed to one or more lower ranking sub-blocks and the data is re-programmed to the matching sub-block of the new memory block in step 812.

Figure 13A:
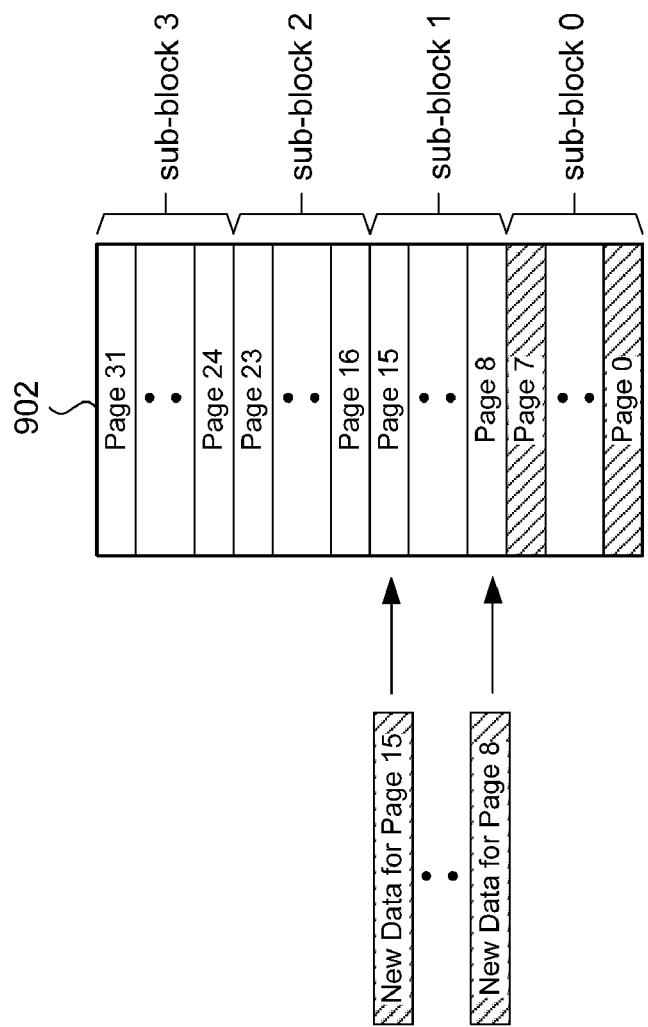
FIGS. 13a, 13b, 13c and 13d are graphical illustrations of data re-programming to another sub-block.
Figure 13A:
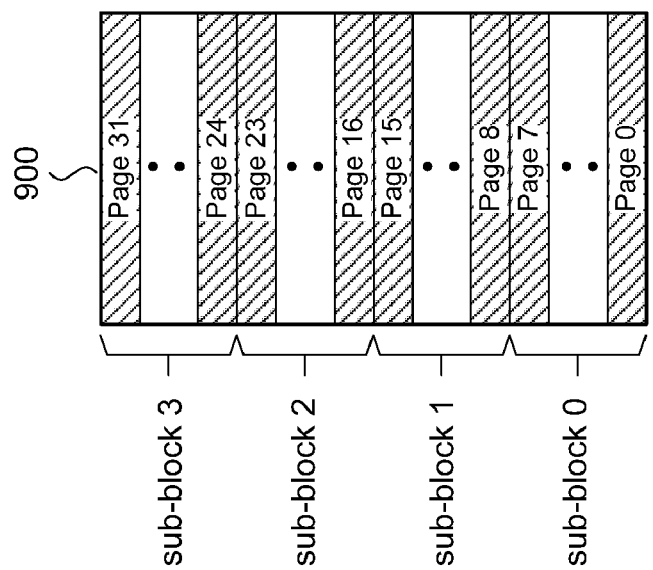

By example, FIG. 13*a* shows an original memory block 900 configured to have sub-blocks 0 to 3, and a new memory block 902 to be assessed, which is also configured to have sub-blocks 0 to 3. Pages with hatching indicate the presence of data, and pages without hatching are empty and previously erased. Assuming that the data of sub-block 1 is to be modified, a matching sub-block 1 is found in memory block 902, which includes data programmed in lower ranking sub-block 0. Since there are no higher ranking sub-blocks with programmed data in memory block 902, the data is programmed to sub-block 1 of memory block 902.

Figure 13B:
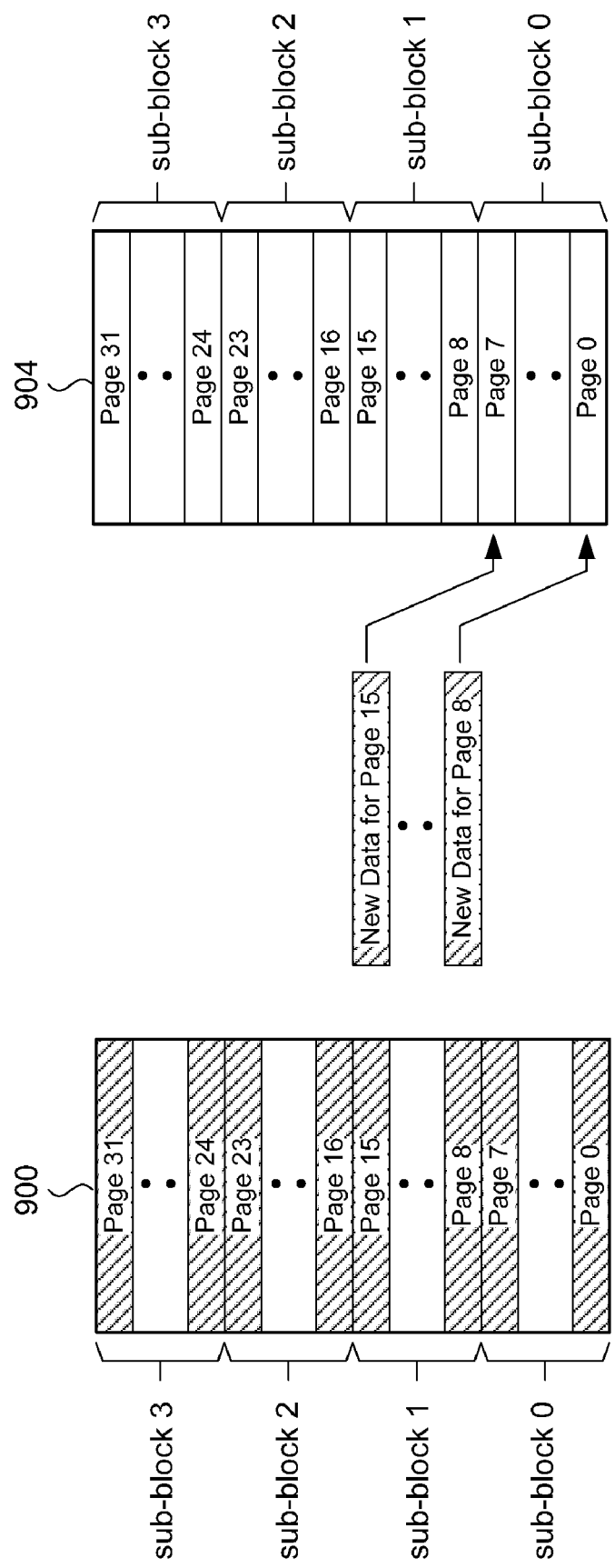

Returning to step 810, if the new memory block is empty, then the data is re-programmed to the first sub-block (sub-block 0) of the memory block at step 814. FIG. 13*b* shows original memory block 900 configured to have sub-blocks 0 to 3, and a new memory block 904 to be assessed, which is also configured to have sub-blocks 0 to 3. In this example, memory block 904 is empty, and the data is programmed to sub-block 0 of empty memory block 904.

In an alternative embodiment, step 810 can be omitted and the data will be programmed to the matching sub-block if the new memory block is empty. According to another alternative embodiment, memory block usage is maximized by including another step to ensure that the new memory block has all its lower ranking sub-blocks populated with data.

Figure 13C:
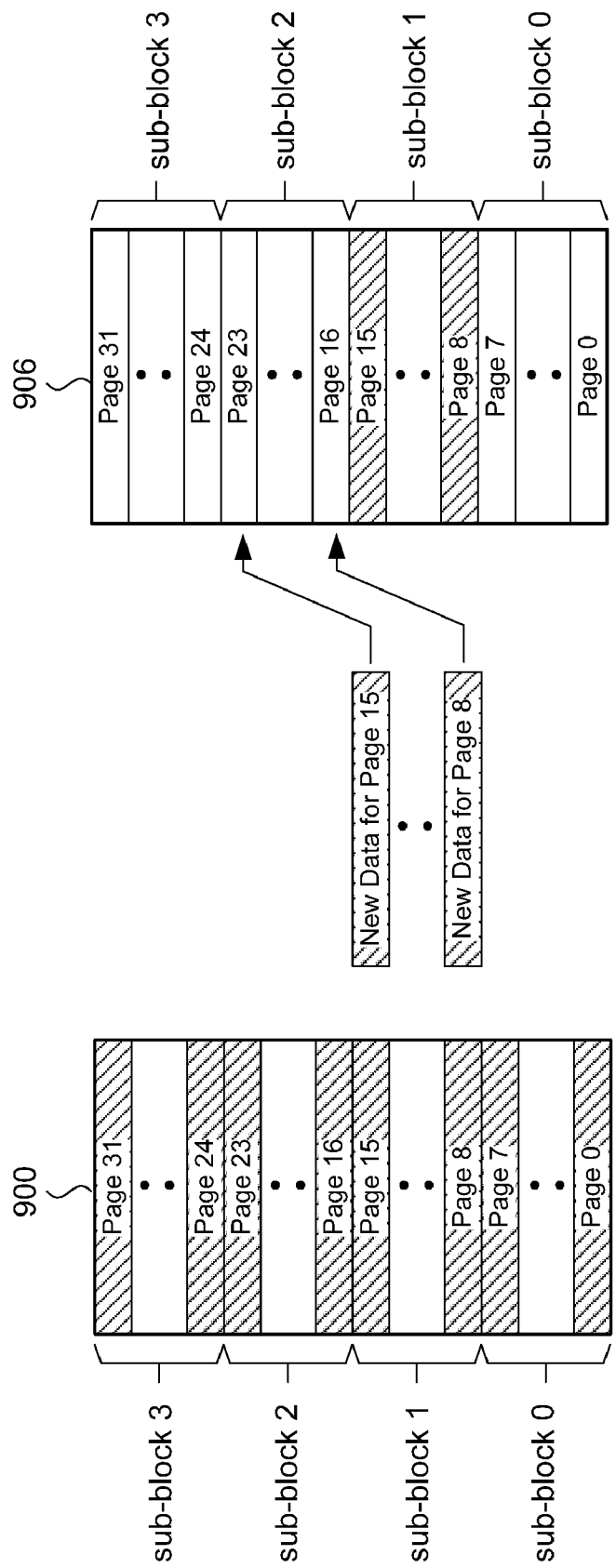
Figure 13D:
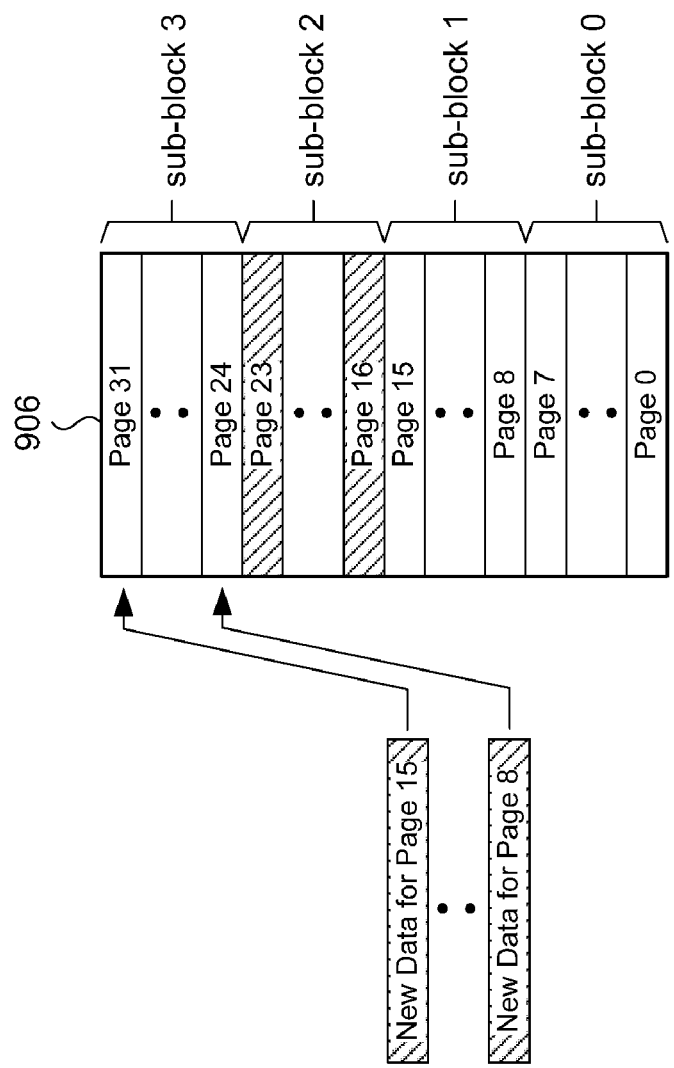
Figure 13D:
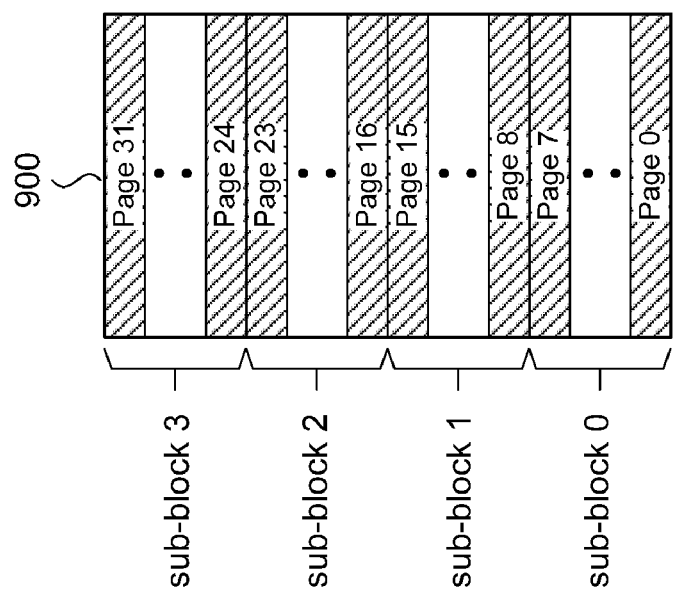

Previously described steps 806, 808, 810, 812 and 814 are the method steps executed if there is a matching sub-block in the new memory block. A situation may arise where all the available memory blocks have higher ranking sub-blocks programmed with data, as determined through iterations of steps 804, 806 and 808. In such a case, the method treat the memory blocks as not having an available matching sub-block. Returning to step 804, if there are no matching physical sub-blocks, then the method proceeds to step 816 for re-programming the data to a sub-block of a higher ranking than the sub-block currently storing the data to be modified. The data can be programmed to the first available higher ranking sub-block or to the lowest ranking sub-block that is available. FIGS. 13*c* and 13*d* illustrate cases where the data is re-programmed to a higher ranking sub-block.

FIG. 13*c* shows original memory block 900 configured to have sub-blocks 0 to 3, and a new memory block 906, both configured to have sub-blocks 0 to 3. In this example, sub-block 1 of memory block 906 currently stores data, thus the data of sub-block 1 of memory block 900 is programmed to sub-block 0 of empty memory block 904. FIG. 13*d* shows the same memory block 900 and a new memory block 908, both configured to have sub-blocks 0 to 3. In this example, sub-block 1 of memory block 908 is empty but higher ranking sub-block 2 stores other data. Therefore, the data is re-programmed to the next highest available sub-block, sub-block 3 in memory block 908.

During the lifetime of the flash memory device, the flash memory controller will monitor the number of program/erase cycles accumulated by each sub-block, which will occur as new data is programmed and old data is modified. Certain sub-blocks in a memory block may have a higher number of program/erase cycles than the other sub-blocks in the memory block. This leads to an imbalance of program/erase cycles between the sub-blocks of the memory block. According to another embodiment, data in the sub-blocks of the memory block can be swapped or moved to different memory blocks when predetermined conditions are met. One such criteria can be a predetermined difference of program/erase cycles between the sub-blocks, for example.

Figure 14:
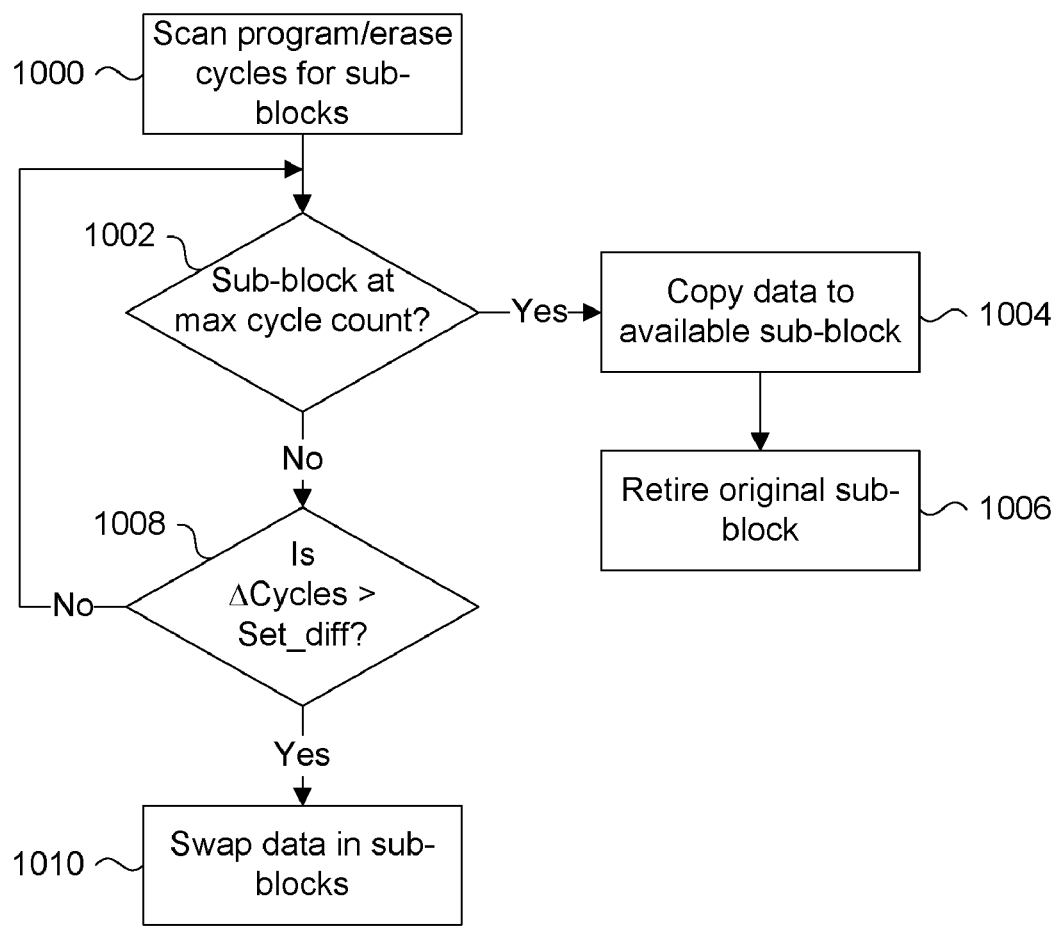
FIG. 14 is a flow chart of a method for controlling program/erase cycle imbalance between sub-blocks of a memory block; and, FIGS. 15a and 15b are graphical illustrations of a memory block before and after data swapping using the method of FIG. 14.

FIG. 14 is a flow chart of a general method for controlling program/erase cycle imbalance between sub-blocks of a memory block. The method can be initiated upon power up of the flash memory device, or at any arbitrary time while the flash memory device is powered up, and is executed by the flash memory controller. At step 1000, the number of program/erase cycles for every pair of sub-blocks in a memory block is scanned. Those skilled in the art will understand that one or more pages of each sub-block will store a counter in a spare field area corresponding to the number of program/erase cycles it has been subjected to. These counter values are read and loaded into the address mapping table of the flash memory controller. At step 1002, a check of the program/erase cycle count for each sub-block of the memory block is made. If the program/erase cycle count has reached the maximum allowed value, then the data stored therein is copied to an available sub-block at step 1004 and the original sub-block is retired or mapped out from further use at step 1006. The copying step of 1004 can follow the method outlined in FIGS. 11 and 12.

Otherwise, the process proceeds to step 1008 where the difference between the sub-block with the highest program/erase count and the sub-block with the lowest program/erase count is calculated to be ΔCycles. If ΔCycles is less than the set limit called "Set_diff", then the method loops back to step 1002 and the next memory block is assessed. On the other hand, if ΔCycles is at least "Set_diff", then the method proceeds to step 1010 where the data in the two sub-blocks are swapped with each other. The value of "Set_diff" is set by the manufacturer of the flash memory system, or the flash memory controller, according to the manufacturer flash management policy. Sub-block swapping of step 1010 is executed by first copying the data stored in all the sub-blocks of the memory block to an available physical block or other available sub-blocks. The original memory block is erased and the data is re-programmed to the sub-blocks of the memory block such that the data of the two sub-blocks are swapped. The other memory block, or the available sub-blocks, acting as temporary storage for the data can be erased at any time by a full memory block erase or a partial erase as previously taught. The address mapping table is then updated to reflect the change in the physical location of the swapped data.

Figure 15B:
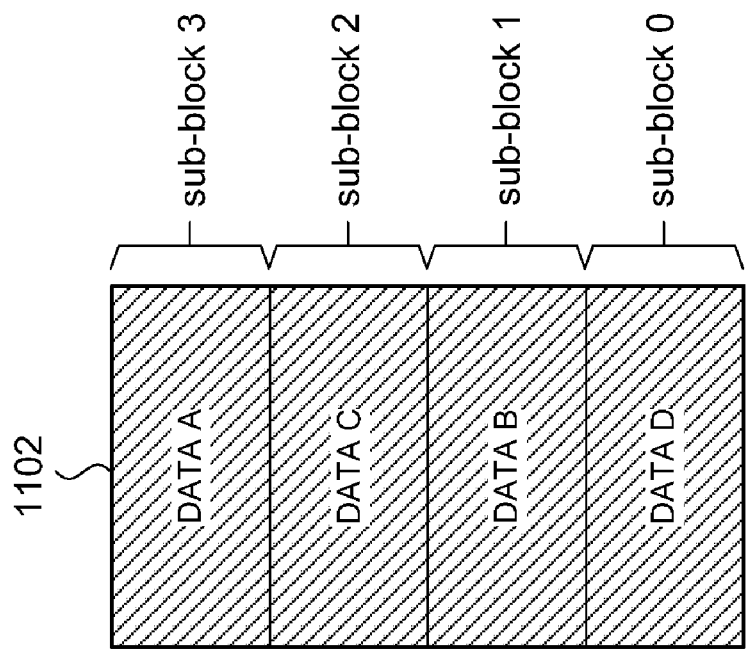
Figure 15A:
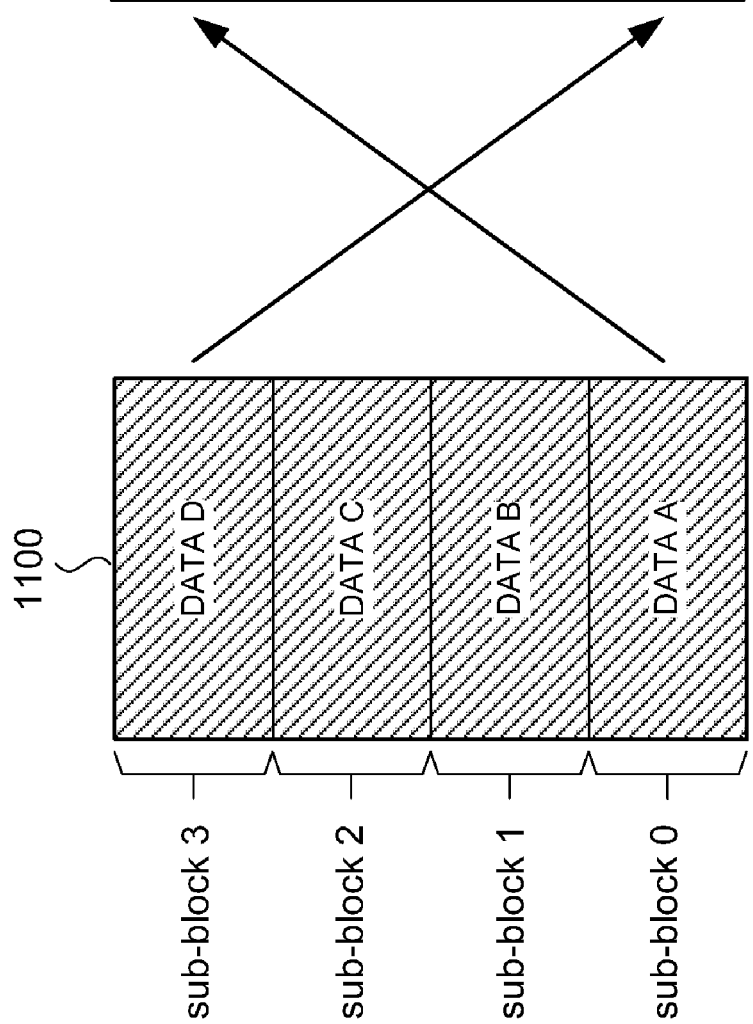

FIG. 15*a* shows an original memory block 1100 configured to have sub-blocks 0 to 3, where sub-block 0 stores data DATA A, sub-block 1 stores DATA B, sub-block 2 stores DATA C and sub-block 3 stores DATA D. If sub-blocks 0 and 3 are determined to have ΔCycles>"Set_diff", then the data is swapped. FIG. 15*b* shows the resulting data mapping in memory block 1100 after data swapping. Now sub-block 0 stores DATA D and sub-block 3 stores DATA A.

Once the data of all the memory blocks have been swapped, normal programming operations can proceed. For example, new data can be programmed to the flash memory device and existing data can be modified.

The previously described embodiments allow for selective erasing of portions of a memory block, called a sub-block, by biasing wordlines bitlines and other relevant signals. The life-span of a memory block may therefore extended since only the sub-block where data is modified is subjected to a program/erase cycle. The sub-blocks can be arbitrary in size, or preset to be specific sizes. A command protocol is provided to allow a flash memory controller to interface with the flash memory device and initiate erasing of arbitrarily sized sub-blocks and preset sized sub-blocks. This command protocol can then be used for executing a wear leveling algorithm when programming new data to the flash memory device, or when modifying existing data stored in the flash memory device. All these aspects can be used by themselves or in combination for extending the life-span of memory blocks.

The previously described embodiments have been described with reference to memory blocks having two or four sub-blocks therein. However, the embodiments are applicable to memory blocks logically divisible into any number of sub-blocks.

In the preceding description, for purposes of explanation, numerous details are set forth in order to provide a thorough understanding of the embodiments. However, it will be apparent to one skilled in the art that these specific details are not required in order to practice the embodiments. In other instances, well-known electrical structures and circuits are shown in block diagram form in order not to obscure the aspects of the embodiments. For example, specific details are not provided as to whether the embodiments described herein are implemented as a software routine, hardware circuit, firmware, or a combination thereof.

The above-described embodiments are intended to be examples only. Alterations, modifications and variations can be effected to the particular embodiments by those of skill in the art without departing from the scope, which is defined solely by the claims appended hereto.

What is claimed is:

1. A flash memory device comprising:
a memory array having at least one block of NAND flash memory cell strings arranged in columns where each of the NAND flash memory cell strings includes flash memory cells, the at least one block having pages programmable in a predetermined direction from a first wordline to a last wordline, and the at least one block also having a sequential set of first wordlines dynamically configurable by a starting address; and,
row circuitry for driving the first wordlines to a first voltage when the substrate is biased to an erase voltage for concurrently erasing the flash memory cells connected to the first wordlines, the row decoders driving second wordlines to a second voltage for inhibiting erasure of the flash memory cells coupled to the second wordlines, the second wordlines including a first unselected wordline up to a last unselected wordline, and the first wordlines including a first selected wordline addressed by the starting address adjacent to the last unselected wordline, up to a last selected wordline.

2. The flash memory device of claim 1, wherein the flash memory cells connected to the sequential set of first wordlines are multi-bit-cells (MBC).

3. The flash memory device of claim 1, wherein the sequential set of first wordlines is a first sequential set of first wordlines, and the at least one block includes a second sequential set of third wordlines, the second sequential set of third wordlines being connected to flash memory cells which are concurrently eraseable, the first sequential set of first wordlines and the second sequential set of third wordlines being non-adjacent to each other.

4. The flash memory device of claim 1, wherein the NAND flash memory cell strings of the at least one block are coupled to a common source line, and the flash memory device further includes a source line voltage control circuit for setting a voltage of the common source line between a third voltage and a fourth voltage during an erase verify operation.

5. The flash memory device of claim 4, wherein the fourth voltage is less than the third voltage, and the voltage of the common source line decreases as a number of first wordlines increases.

6. The flash memory device of claim 1, wherein the last selected wordline includes the last wordline.

7. The flash memory device of claim 1, wherein the flash memory cells that are connected to third wordlines between the last selected wordline and a select device store data.

8. The flash memory device of claim 7, wherein the flash memory cells that are connected to the third wordlines are repeatedly erasable and programmable.

9. The flash memory device of claim 1, wherein the flash memory cells that are connected to third wordlines between the last selected wordline and a select device are erased.

10. The flash memory device of claim 9, wherein the flash memory cells connected to the first wordlines are repeatedly erasable and programmable while the flash memory cells that are connected to the third wordlines are erased.

11. A flash memory device comprising:
a memory array having at least one block of NAND flash memory cell strings arranged in columns, the at least one block having pages programmable in a predetermined direction from a first page to a last page; and,
row circuitry for concurrently erasing a sequential set of pages dynamically configurable by a starting address, when the substrate is biased to an erase voltage.

12. The flash memory device of claim 11, wherein the sequential set of pages forms a sub-block.

13. The flash memory device of claim 12, wherein the sub-block includes the pages from the first page to a first intermediate page.

14. The flash memory device of claim 13, wherein the sub-block is a lower sub-block, and the pages from a second intermediate page adjacent to the first intermediate page to the last page form at least one upper sub-block.

15. The flash memory device of claim 12, wherein the sub-block includes the pages from a first intermediate page to the last page.

16. The flash memory device of claim 15, wherein the sub-block is an upper sub-block, and the pages from the first intermediate page to a second intermediate page adjacent to the first intermediate page form at least one lower sub-block.

17. The flash memory device of claim 16, wherein the at least one lower sub-block is inhibited from being erased while the upper sub-block is being erased.

18. The flash memory device of claim 12, wherein the sub-block includes the pages from a first intermediate page to a second intermediate page.

19. The flash memory device of claim 1, wherein the last selected wordline is addressable by an end address.

20. The flash memory device of claim 19, wherein the end address is preset as the last wordline.

21. The flash memory device of claim 19, wherein the end address addresses the last selected wordline between the first selected wordline addressed by the starting address and the last wordline.

22. The flash memory device of claim 11, wherein a first selected page of the sequential set of pages is addressable by the starting address.

23. The flash memory device of claim 22, wherein a last selected page of the sequential set of pages is addressable by an end address.

24. The flash memory device of claim 23, wherein the end address is preset as being a last page of the at least one block.

* * * * *